United States Patent
Bulovic et al.

(10) Patent No.: US 9,991,076 B2
(45) Date of Patent: Jun. 5, 2018

(54) ELECTROMECHANICAL DEVICE

(71) Applicant: Massachusetts Institute of Technology, Cambridge, MA (US)

(72) Inventors: Vladimir Bulovic, Lexington, MA (US); Jeffrey H. Lang, Sudbury, MA (US); Hae-Seung Lee, Lexington, MA (US); Timothy M. Swager, Newton, MA (US); Trisha L. Andrew, Madison, WI (US); Matthew Eric D'Asaro, Cambridge, MA (US); Parag Deotare, Medford, MA (US); Apoorva Murarka, Cambridge, MA (US); Farnaz Niroui, Ontario (CA); Ellen Sletten, Somerville, MA (US); Annie I-Jen Wang, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 284 days.

(21) Appl. No.: 14/763,681

(22) PCT Filed: Jan. 28, 2014

(86) PCT No.: PCT/US2014/013403
§ 371 (c)(1),
(2) Date: Jul. 27, 2015

(87) PCT Pub. No.: WO2014/117161
PCT Pub. Date: Jul. 31, 2014

(65) Prior Publication Data
US 2015/0357142 A1     Dec. 10, 2015

Related U.S. Application Data

(60) Provisional application No. 61/842,667, filed on Jul. 3, 2013, provisional application No. 61/841,684, filed
(Continued)

(51) Int. Cl.
    *H02N 1/00*     (2006.01)
    *H01L 41/00*     (2013.01)
    (Continued)

(52) U.S. Cl.
CPC ........ *H01H 59/0009* (2013.01); *H01H 49/00* (2013.01); *H01L 45/00* (2013.01); *Y10T 156/10* (2015.01)

(58) Field of Classification Search
CPC .................................. H02N 1/06; H02N 1/08
(Continued)

(56) References Cited

U.S. PATENT DOCUMENTS 3,125,739 A     3/1964    Deibel et al.
5,013,693 A     5/1991    Guckel et al.
(Continued)

FOREIGN PATENT DOCUMENTS

CN     101656176 A     2/2010
WO     WO 2010/054014 A1     5/2010
WO     WO 2012/061830 A1     5/2012

OTHER PUBLICATIONS

International Search Report and Written Opinion for Application No. PCT/US2014/013403 dated May 12, 2014.
(Continued)

*Primary Examiner* — Jose Gonzalez Quinone
(74) *Attorney, Agent, or Firm* — Wolf, Greenfield & Sacks, P.C.

(57) ABSTRACT

Electromechanical devices described herein may employ tunneling phenomena to function as low-voltage switches. Opposing electrodes may be separated by an elastically deformable layer which, in some cases, may be made up of a non-electrically conductive material. In some embodiments, the elastically deformable layer is substantially free of electrically conductive material. When a sufficient actua-
(Continued)

Modulation of tunneling gap through an applied electrostatic force tion voltage and/or force is applied, the electrodes are brought toward one another and, accordingly, the elastically deformable layer is compressed. Though, the elastically deformable layer prevents the electrodes from making direct contact with one another. Rather, when the electrodes are close enough to one another, a tunneling current arises therebetween. The elastically deformable layer may exhibit spring-like behavior such that, upon release of the actuation voltage and/or force, the separation distance between electrodes is restored. Thus, the electromechanical device may be actuated between open and closed switch positions.

20 Claims, 29 Drawing Sheets

Related U.S. Application Data on Jul. 1, 2013, provisional application No. 61/757,460, filed on Jan. 28, 2013.

(51) Int. Cl.
*H01H 59/00* (2006.01)
*H01H 49/00* (2006.01)
*H01L 45/00* (2006.01)

(58) Field of Classification Search
USPC .................. 310/309, 323.11, 323.06, 313 B
See application file for complete search history.

(56) References Cited

U.S. PATENT DOCUMENTS

| | | | |
|---|---|---|---|
| 5,989,700 A | 11/1999 | Krivopal | |
| 6,091,125 A | 7/2000 | Zavracky | |
| 6,121,870 A | 9/2000 | Ariga et al. | |
| 6,316,832 B1 | 11/2001 | Tsuzuki et al. | |
| 6,586,791 B1 | 7/2003 | Lee et al. | |
| 6,707,308 B1 | 3/2004 | Michalewicz | |
| 6,876,404 B2 | 4/2005 | Park et al. | |
| 7,256,063 B2 | 8/2007 | Pinkerton et al. | |
| 7,270,776 B2 | 9/2007 | Mori et al. | |
| 7,382,648 B2 | 6/2008 | Bockrath | |
| 7,550,354 B2 | 6/2009 | Zhu | |
| 7,638,350 B2 | 12/2009 | Deconde et al. | |
| 7,659,138 B2 | 2/2010 | Hirakata et al. | |
| 7,701,013 B2 | 4/2010 | Zhu | |
| 7,839,028 B2 | 11/2010 | Pinkerton | |
| 7,851,787 B2 | 12/2010 | Han | |
| 7,864,505 B1* | 1/2011 | O'Brien | H01G 4/203 361/303 |
| 8,115,344 B2 | 2/2012 | Feng et al. | |
| 8,324,017 B2 | 12/2012 | Han | |
| 8,338,728 B2 | 12/2012 | Pinkerton | |
| 8,343,816 B2 | 1/2013 | Imahayashi et al. | |
| 8,372,686 B2 | 2/2013 | Yamada et al. | |
| 8,385,113 B2 | 2/2013 | Pinkerton | |
| 8,405,073 B2 | 3/2013 | Ono et al. | |
| 2004/0238707 A1 | 12/2004 | Pinkerton et al. | |
| 2004/0238907 A1 | 12/2004 | Pinkerton et al. | |
| 2005/0211978 A1* | 9/2005 | Bu | B82Y 10/00 257/40 |
| 2006/0220781 A1* | 10/2006 | Kuwashima | G01L 1/005 338/32 R |
| 2007/0236623 A1 | 11/2007 | Heo et al. | |
| 2008/0203384 A1 | 8/2008 | Akkerman et al. | |
| 2008/0241559 A1* | 10/2008 | Joo | B82Y 10/00 428/460 |
| 2008/0266931 A1* | 10/2008 | Tang | G11C 11/16 365/148 |
| 2010/0116630 A1 | 5/2010 | Pinkerton | |
| 2011/0274917 A1* | 11/2011 | Omata | A61L 29/14 428/336 |
| 2012/0112152 A1* | 5/2012 | Bulovic | H01L 45/00 257/2 |
| 2012/0115266 A1* | 5/2012 | Chen | H01L 51/0003 438/46 |
| 2012/0292707 A1 | 11/2012 | Toh et al. | |
| 2013/0081931 A1 | 4/2013 | Pinkerton | |
| 2013/0127694 A1 | 5/2013 | Kim et al. | |
| 2013/0137212 A1 | 5/2013 | Ha et al. | |
| 2013/0204157 A1 | 8/2013 | Clark et al. | |

OTHER PUBLICATIONS

International Preliminary Report on Patentability for Application No. PCT/US2014/013403 dated Aug. 6, 2015.

Extended European Search Report for Application No. EP 14742743.9 dated Jul. 21, 2016.

Czaplewski et al., A nanomechanical switch for integration with CMOS logic. Journal of Micromechanics and Microengineering. 2009;(19):1-12.

Dadgour et al., Design and analysis of compact ultra energy-efficient logic gates using laterally-actuated double-electrode NEMS. Proceedings: IEEE Design Automation Conference. 2010: 893-6.

Guo et al., Measurement and statistical analysis of single-molecule current-voltage characteristics, transition voltage spectroscopy, and tunneling barrier height. Journal of the American Chemical Society. 2011;(133):19189-97.

Jang et al., NEMS switch with 30 nm-thick beam and 20 nm-thick air-gap for high density non-volatile memory applications. Solid State Electronics. 2008;(52):1578-83.

Lee et al., 3 terminal nanoelectromechanical switching device in insulating liquid media for low voltage operation and reliability improvement. IEEE Electron Devices Meeting (IEDM). 2009:1-4.

Lee et al., A sub-1-volt nanoelectromechanical switching device. Nat Nanotechnol. Jan. 2013;8(1):36-40.

Lober et al., Surface-micromachining processes for electrostatic microactuator fabrication. In Solid-State Sensor and Actuator Workshop (IEEE). Technical Digest. 1988: 59-62.

Nathanael et al., 4-terminal relay technology for complementary logic. IEEE International Electron Devices Meeting (IEDM). 2009:1-4.

Niskala et al., Metal-Molecule-Metal Junctions via PFPE Assisted Nanotransfer Printing (nTP) onto Self-Assembled Monolayers. Journal of the American Chemical Society. 2009;(131):13202-3.

Parsa et al., Nanoelectromechanical relays with decoupled electrode and suspension. Proceedings: IEEE Mems Workshop. 2011: 1361-4.

Paydavosi et al., MEMS switches employing active metal-polymer nanocomposites. IEEE 25th International Conference on Micro Electro Mechanical Systems (MEMS). Paris. 2012:180-3.

Simmons, Electric Tunnel Effect between Dissimilar Electrodes Separated by a Thin Insulating Film. Journal of Applied Physics. Jun. 1963;34(9):2581-90.

* cited by examiner

Modulation of tunneling gap through an applied electrostatic force

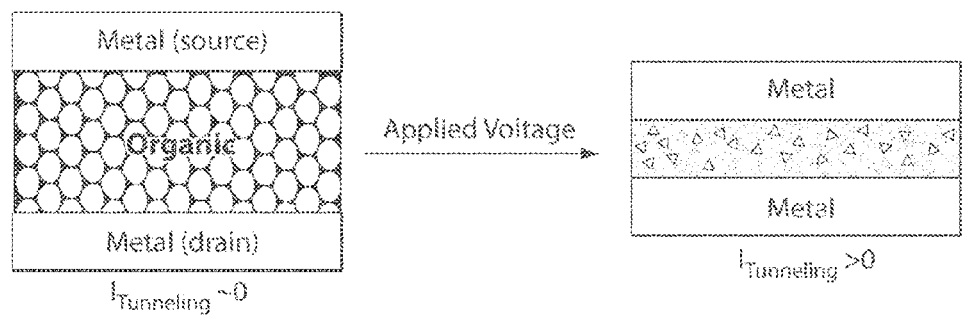
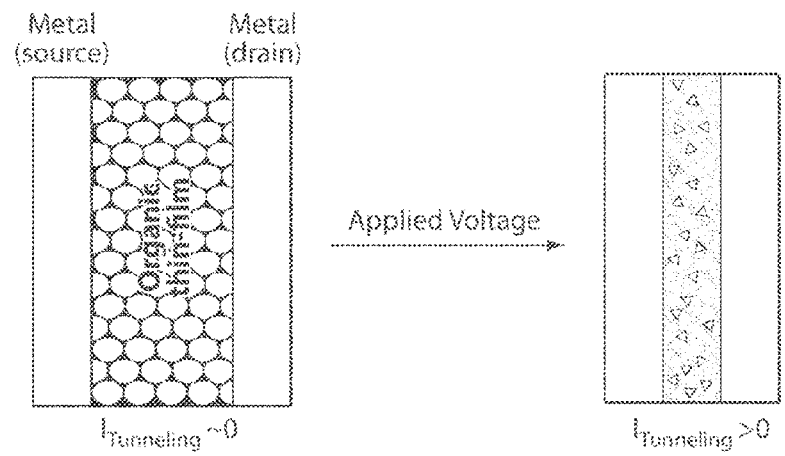
Fig. 5

Self-assembled monolayers
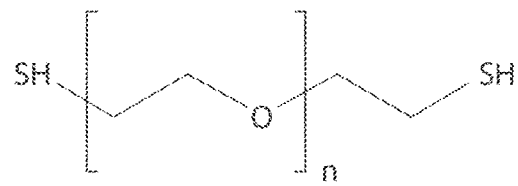
Polyethylene glycol dithiol
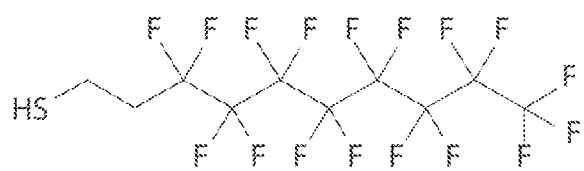
Fluorinated alkanethiol
Evaporated/spin-coated organic layers
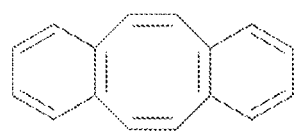
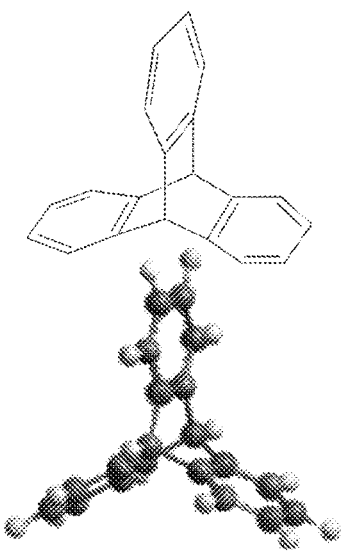
Triptycene     1,5-Dibenzocyclooctatetraene
Fig. 16

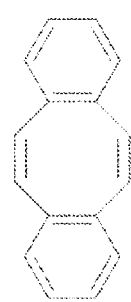
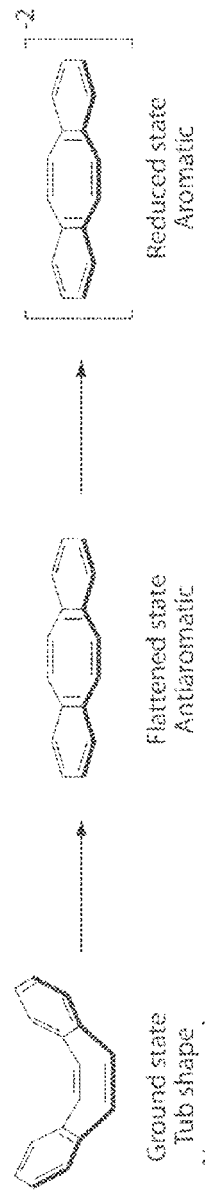
dibenzoCOT
Fig. 19A
Ground state
Tub shape
Non-aromatic
Flattened state
Antiaromatic
Fig. 19B
Reduced state
Aromatic
Electrical actuation
or mechanical force
Fig. 19C

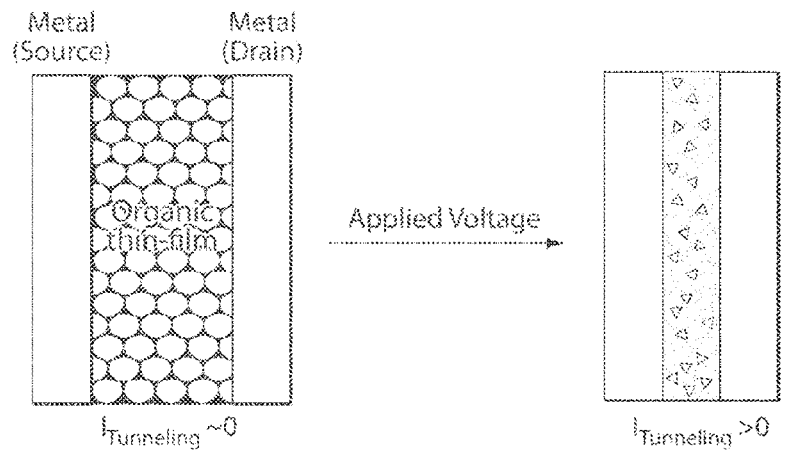
Devices based on lateral cantilevers
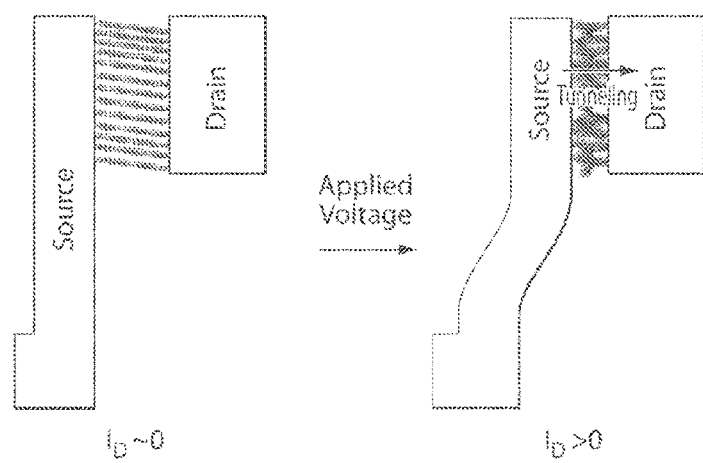
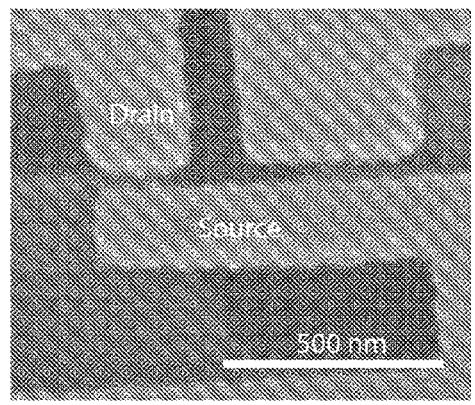
Fig. 26

$$I = \left(\frac{qA}{4\pi^2\hbar G^2}\right)\left\{\left(\Phi - \frac{qV}{2}\right)\exp\left[-\frac{2(2m)^{1/2}}{\hbar}\alpha\left(\Phi - \frac{qV}{2}\right)^{1/2}G\right]\right.$$
$$\left. - \left(\Phi + \frac{qV}{2}\right)\exp\left[-\frac{2(2m)^{1/2}}{\hbar}\alpha\left(\Phi + \frac{qV}{2}\right)^{1/2}G\right]\right\}$$

$\Phi$ : Tunneling barrier
A : Top contact area
G : Electrode-electrode gap
$\alpha$ : Adjustable parameter

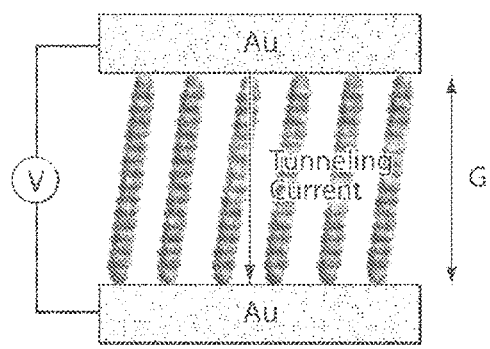

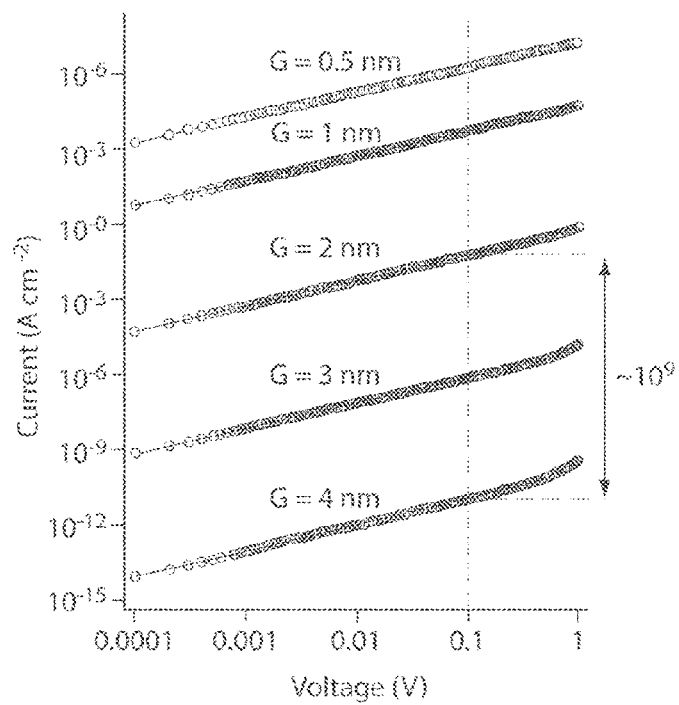

Fig. 27

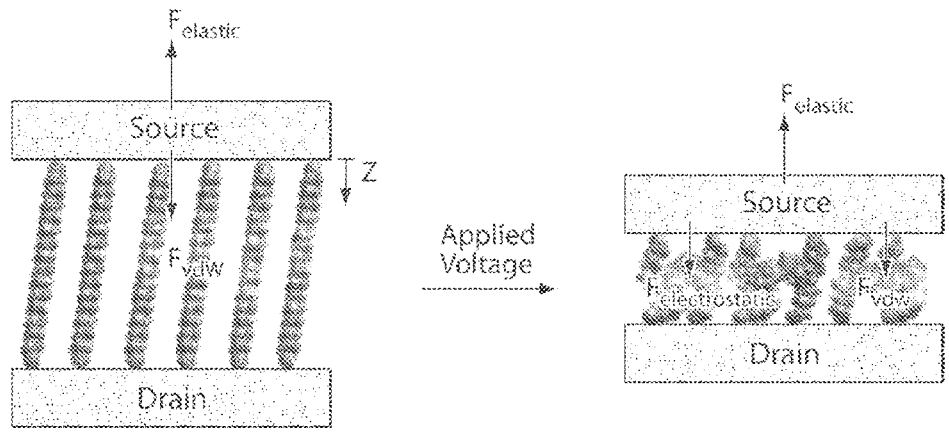
$$m\frac{d^2z}{dt^2} = \underbrace{\frac{\varepsilon_r \varepsilon_0 A V^2}{2(G_0 - z)^2}}_{F_{Electrostatic}} + \underbrace{\frac{A_H A}{6\pi(G_0 - z)^3}}_{F_{van\,der\,Waals}} - \underbrace{kz}_{F_{Elastic}}$$
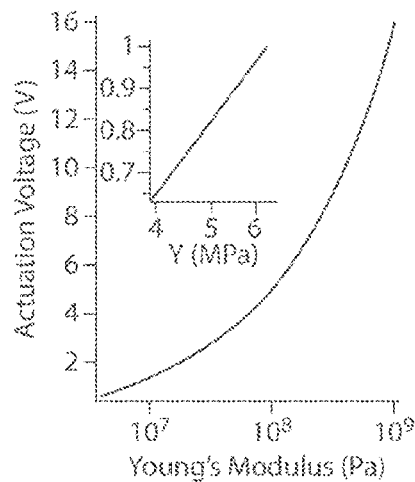
| Y (MPa) | $V_{actuation}$ (V) | $E_{switching}$ (keV) | $T_{switching}$ (ns) |
|---|---|---|---|
| 4 | 0.64 | 0.50 | 9.2 |
| 10 | 1.5 | 1.9 | 3.2 |
| 100 | 5.0 | 21 | 0.91 |
| 1000 | 16 | 210 | 0.21 |
Fig. 29

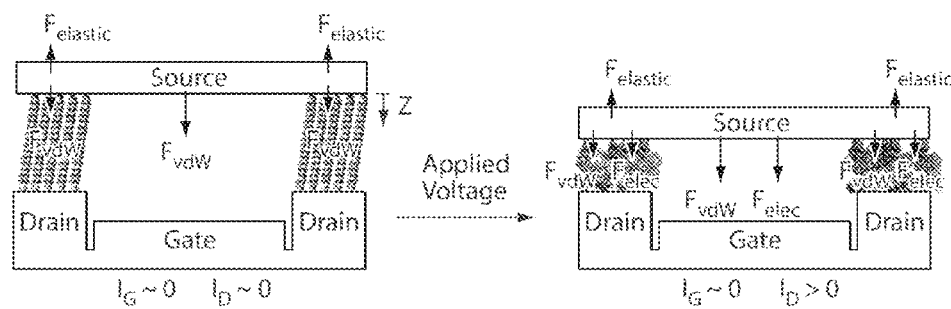
$A_{Source} = 400$ nm x 150 nm
$A_{Gate} = 300$ nm x 150 nm
$A_{Drain} = 40$ nm x 150 nm
Actuation voltage = 0.54 V
Switching energy = 0.68 keV
Switching time = 17 ns
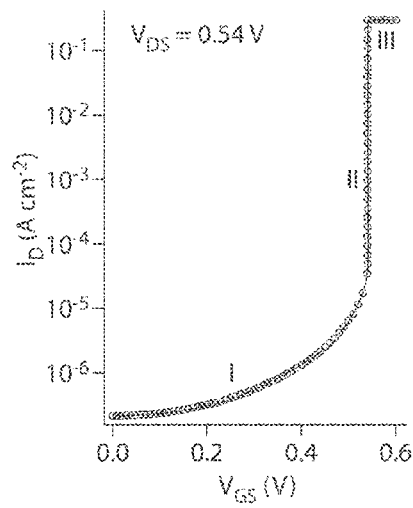
Fig. 30

| Young's Modulus [Pa] | Minimum Actuation Voltage [V] | Energy [eV/μm²] (Number of electrons/μm²) | Relaxation/ Opening Time (ns) | Compression/ Closing Time (ns) | Switching Time (ns) |
|---|---|---|---|---|---|
| 10³ | 0.014 | 15 (1100 e⁻) | 120 | 250 | 370 |
| 10⁴ | 0.045 | 150 (3300 e⁻) | 36 | 75 | 110 |
| 10⁵ | 0.14 | 1500 (11,000 e⁻) | 12 | 25 | 37 |
| 10⁶ | 0.45 | 15,000 (33,000 e⁻) | 3.6 | 7.5 | 11 |
| 10⁷ | 1.40 | 1.5×10⁵ (1.1×10⁵ e⁻) | 1.2 | 2.5 | 3.7 |
| 10⁸ | 4.50 | 1.5×10⁶ (3.3×10⁵ e⁻) | 0.36 | 0.75 | 1.1 |
| 10⁹ | 14.0 | 1.5×10⁷ (1.1×10⁶ e⁻) | 0.12 | 0.25 | 0.37 |

Fig. 31

ELECTROMECHANICAL DEVICE

CROSS-REFERENCE TO RELATED APPLICATIONS

This application is a U.S. National Phase of PCT/US2014/013403, filed Jan. 28, 2014, and titled "ELECTROMECHANICAL DEVICE," which claims the benefit under 35 U.S.C. § 119(e) of U.S. Provisional Patent Application Ser. No. 61/757,460, filed Jan. 28, 2013, and titled "ANALOG CIRCUITRY BASED ON NANOELECTROMECHANICAL TUNNELING DEVICES," U.S. Provisional Patent Application Ser. No. 61/841,684, filed Jul. 1, 2013, and titled "TUNNELING NANOELECTROMECHANICAL SWITCHES USING ORGANIC THIN FILMS,", and U.S. Provisional Patent Application Ser. No. 61/842,667, filed Jul. 3, 2013, and titled "ELECTROMECHANICAL DEVICE," each of which are hereby incorporated herein by reference in their entirety.

STATEMENT REGARDING FEDERALLY SPONSORED RESEARCH OR DEVELOPMENT

This invention was made with Government support under Grant No. EECS0939514 awarded by the National Science Foundation. The Government has certain rights in the invention.

BACKGROUND

1. Field of the Invention

Aspects described herein relate to electromechanical devices, functions, uses and manufacture thereof.

2. Related Art

With the rise of consumer electronics, there is an increasing need for digital electronics to become more efficient. For example, there is a desire for electronic devices to exhibit reduced energy loss and fluctuations due to variations in temperature, with use.

Electronic devices include numerous electrically actuated switches (e.g., MOSFETs, MEMS) as well as other electrical components between switches that transmit and store charge, such as wires and capacitors. During use, the wires and capacitors associated with these electronic devices are continuously discharged and recharged, in part, due to the application of large actuation voltages, leading to overall energy dissipation and loss. Further, when MOSFETs or MEMS are switched off, a leakage current is typically present residually within the transistor, leading to additional energy loss.

SUMMARY

The present disclosure relates to electromechanical devices that may be used as electronic switching elements. Such devices may be actuated between open and closed switch positions by application of a relatively low voltage between electrodes. In some embodiments, when in a closed switch position, electrons may flow from one electrode to another via tunneling phenomena, rather than through direct contact between electrodes. Such devices may also exhibit a relatively low leakage current, if any, when placed in the open switch position.

For example, electromechanical devices in accordance with the present disclosure may include two electrodes that may be actuated between respective open and closed switch positions. When in an open switch position ("off" state), the electrodes may be spaced a particular distance from one another such that little to no current flows between the electrodes. When in a closed switch position ("on" state), the electrodes may be spaced comparatively closer to one another so that a suitable current (e.g., tunneling current) flows therebetween. In some embodiments, the current that flows between electrodes when in a closed switch position is $10^6$ times or more greater than the current that flows between electrodes when in an open switch position.

For some embodiments, an elastically deformable layer may be disposed between the electrodes. This layer may be squeezed or otherwise compressed when a suitable actuation voltage and/or force is applied to the electrodes. When the electrodes are appropriately actuated so as to exhibit relative movement toward one another, to reach a closed switch position, current is allowed to flow therethrough. Though, despite being in an "on" state, the elastically deformable layer also prevents the electrodes from contacting one another. Such an elastically deformable layer may, in some embodiments, be substantially free of electrically conductive material. Upon suitable release of the actuation voltage and/or force, the elastically deformable layer may provide a restoring force to the electrodes so as to return the device back to an "off" state.

In some embodiments, upon application of an appropriate actuation potential difference (e.g., depending on the application, less than about 10.0 V, less than about 5.0 V, or less than about 1.0 V) between electrodes, the device may alter configuration from an open switch position to a closed switch position. For example, applying such an actuation potential may give rise to an electrostatic attractive force between electrodes, causing relative movement of the electrodes toward one another. Such movement may result in compression of the elastically deformable layer disposed between the electrodes. When the electrodes are in sufficiently close proximity to one another, even without contacting one another, a suitable tunneling current may flow between the electrodes.

In an illustrative embodiment, an electromechanical device is provided. The device includes a first electrode; a second electrode spaced from the first electrode; and an elastically deformable layer, substantially free of electrically conductive material, disposed between the first electrode and the second electrode.

In another illustrative embodiment, an electromechanical device is provided. The device includes a first electrode; a second electrode spaced less than 20 nm from the first electrode; and an elastically deformable layer disposed between the first electrode and the second electrode, the elastically deformable layer comprising a non-electrically conductive material.

In yet another illustrative embodiment, an electromechanical device is provided. The device includes a first electrode; a second electrode spaced from the first electrode; and an elastically deformable material disposed between the first electrode and the second electrode, wherein the electrodes are constructed and arranged such that, upon application of a potential difference of no more than 1.0 V between the first and second electrodes, the potential difference causes a relative position of the electrodes to change from an open switch position to a closed switch position.

In another illustrative embodiment, an electromechanical device is provided. The device includes a first electrode; a second electrode spaced from the first electrode; and an elastically deformable material disposed between the first electrode and the second electrode, wherein the electrodes are constructed and arranged such that, upon compression of the elastically deformable material, the compression causes the first and second electrodes to move from an open switch position to a closed switch position, wherein a direct tunneling current that flows between the electrodes while in the closed switch position is at least $10^6$ greater than a direct tunneling current that flows between the electrodes while in the open switch position.

In a further illustrative embodiment, a method of operating an electromechanical device is provided. The method includes compressing an elastically deformable layer disposed between a first electrode and a second electrode to result in a closed switch position comprising a direct tunneling current between the first and second electrodes; and releasing pressure from the elastically deformable layer to result in an open switch position comprising a direct tunneling current between the first and second electrodes, wherein the direct tunneling current that flows between the electrodes while in the closed switch position is at least $10^6$ greater than a direct tunneling current that flows between the electrodes while in the open switch position.

In another illustrative embodiment, a method of manufacturing an electromechanical device. The method includes forming a first electrode on a substrate; depositing an elastically deformable layer, substantially free of electrically conductive material, adjacent to the first electrode; and forming a second electrode spaced from the first electrode.

Other advantages and novel features of the invention will become apparent from the following detailed description of various non-limiting embodiments when considered in conjunction with the accompanying figures and claims.

BRIEF DESCRIPTION OF THE DRAWINGS

Various accompanying drawings are not intended to be drawn to scale. For purposes of clarity, not every component may be labeled in every drawing. In the drawings:

FIGS. 5-7 illustrate various electromechanical devices in accordance with some embodiments;

FIGS. 16-19 show various materials that may be employed in electromechanical devices in accordance with some embodiments;

FIG. 26 illustrates various electromechanical devices in accordance with some embodiments;

FIG. 27 depicts the relationship between current and voltage for various electromechanical devices in accordance with some embodiments;

FIG. 29 depicts the relationship between actuation voltage and stiffness for various electromechanical devices in accordance with some embodiments;

FIG. 30 shows the relationship between drain current and gate-source voltage for various electromechanical devices in accordance with some embodiments; and FIG. 31 illustrates a table with various properties for various electromechanical devices in accordance with some embodiments.

DETAILED DESCRIPTION

The inventors have appreciated that it may be advantageous to produce electromechanical devices that employ electrical tunneling phenomena as the primary manner in which current flows between electrodes during operation. Electromechanical devices in accordance with the present disclosure may include two or more electrodes spaced a suitable distance apart, and which may be actuated between open and closed switch positions by causing relative movement of the electrodes toward or away from one another. Accordingly, such devices may be squeezable or otherwise compressible between open and closed switch positions.

For some embodiments, an electromechanical device in accordance with the present disclosure may be referred to as a "squitch," for example, a device that functions as a switch that may be actuated between an open and closed switch positions through squeezing or an otherwise compressive act.

When the electrodes are spaced sufficiently far apart from one another such that electrical current does not flow or the amount of current between electrodes is negligible (e.g., tunneling and/or leakage current between electrodes is minimal, or largely unable to occur), the device is in an open switch position (in an "off" state). In some embodiments, electrodes spaced up to 4 nm apart or greater may be considered to be in an open switch position.

When the electrodes are spaced sufficiently close to one another such that a suitable amount of electrical current, whether through direct electric flow or tunneling current, is permitted to flow between electrodes, the device is in a closed switch position. In some embodiments, electrodes spaced as low as 2 nm apart or less may be considered to be in a closed switch position. In some embodiments, the direct tunneling current that flows between the electrodes while in the closed switch position (e.g., spaced less than 2 nm, or 3 nm apart) is at least $10^6$ greater than the direct tunneling current that flows between the electrodes while in the open switch position (e.g., spaced greater than 3 nm, or 4 nm apart).

Aspects of the present disclosure provide for electrical systems with elements having nanoscale structural features that may be actuated repeatedly between "on" and "off" states using relatively low voltages (e.g., less than 1.0 V or, in some cases, less than 10.0 V), for example, to impart electrostatic attraction between opposing electrodes. Accordingly, such devices may be well suited for low power applications. Embodiments of the present disclosure may be suitable for a variety of different uses and implementations, for example, including electronics products, medical applications, autonomous applications powered by energy harvesters, sensors, actuators, microphones, etc.

Figure 1:
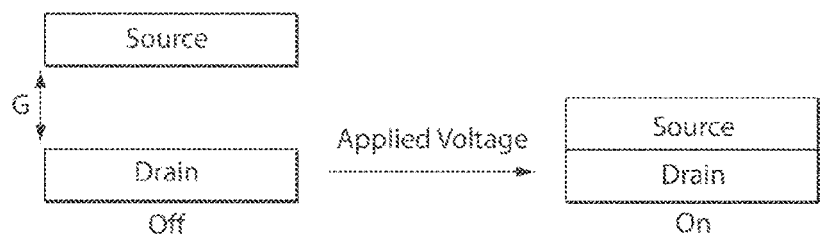
FIG. 1 shows an electromechanical device actuated between closed and open switch positions.

FIG. 1 depicts an electromechanical device having a source electrode and a drain electrode disposed opposite one another such that a gap G exists between the electrodes. Initially, the gap G provides enough of a separation between the source and drain electrodes such that the device is in an open switch position. When in an open switch position, no current, or only a negligible amount of current, is able to flow between electrodes.

When a suitable voltage is applied in an appropriate manner, for example, between the source and drain electrodes, or between the source and a gate electrode (not shown in this figure), the source and drain electrodes are actuated, via electrostatic force, so as to move from an open switch position to a closed switch position. As a result, in the closed switch position, a suitable amount of current is able to flow between electrodes. For example, as further shown in FIG. 1, the source and drain electrodes are moved into direct contact with one another, establishing an electrical connection that permits current to flow therebetween.

In the past, conventional electromechanical devices have required a substantial voltage difference (e.g., depending on the application, greater than 1.0 V, greater than 5.0 V, greater than 10.0 V) to adequately actuate such electrodes from an open switch position to a closed switch position. When such conventional electromechanical devices are subject to an insufficient actuation voltage, the electrodes remain in the open switch position, unable to close the switch without further applied actuation force of the electrodes toward one another.

Aspects of the present disclosure relate to electromechanical devices that only require a relatively small amount of voltage difference between opposing electrodes to bring electrodes in sufficient proximity to one another so that an electrical current (e.g., tunneling current) is able to flow therebetween. Electromechanical devices of the present disclosure may be configured for actuation between open and closed switch positions due to the application of a suitable voltage difference between the electrodes, for example, so as to cause relative attraction between the electrodes.

In some embodiments, the voltage difference between electrodes that is sufficient to cause the electrodes to actuate to a closed switch position is less than 1.0 V, less than 0.8 V, less than 0.5 V, less than 0.3 V, between 0.1 V and 1.0 V, between 0.1 V and 0.5 V, between 0.1 V and 0.3 V, etc. Such voltage differences that result in suitable actuation of the switch may be appropriate for CMOS applications. Though, devices in accordance with the present disclosure may be suitable for use in other applications. In some embodiments, the voltage difference between electrodes adequate to cause the electrodes actuation to a closed switch position is less than 15.0 V, less than 12.0 V, less than 10.0 V, less than 8.0 V, less than 6.0 V, less than 4.0 V, less than 2.0 V, between 0.1 V and 10.0 V, between 0.5 V and 5.0 V, between 1.0 V and 5.0 V, or between 5.0 V and 10.0 V. It can be appreciated that a voltage difference appropriate to cause actuation of the electrodes may fall within ranges defined by any of the end points listed above, or may fall outside of the above-noted ranges.

Further, in conventional electromechanical devices, once the source and drain electrodes come into contact with one another, there is a tendency for the electrodes to stick together, or exhibit stiction, limiting repeatable actuation of the device between open and closed switch positions. For example, when a sufficient voltage is applied between source and drain electrodes such that the electrodes come into contact with one another, it is possible for the electrodes to undesirably adhere.

As shown in the $F_{Electrostatic}$ equation of FIG. 1, as the separation distance provided by the gap G decreases, the amount of actuation voltage used to close the switch also decreases. However, with this decrease in separation distance provided by the gap G, the degree of adhesion between electrodes, due to attractive van der Waals forces, given by the $F_{vdw}$ equation, increases.

Aspects of the present disclosure further relate to electromechanical devices that may be repeatably actuated between open and closed switch positions, without the occurrence or concern of stiction between electrodes. Stiction, as described herein, may be characterized as a phenomenon where two surfaces adhere together when in close proximity, for example, due to electrostatic, Van der Waals and/or hydrogen bonding forces. Put another way, stiction is the static friction threshold between two objects adhered to one another that would need to be overcome for the objects to be separated from one another.

For instance, as discussed further below, an elastically deformable material may be positioned between the electrodes, obstructing direct contact from occurring therebetween upon actuation from the open to closed switch position, yet also providing a restoring force upon removal of the actuation voltage/force. This restoring force may be useful to return the device back to an open switch position, when desired. Thus, embodiments in accordance with the present disclosure may allow for repeated actuation between open and closed switch positions, while eliminating or otherwise substantially reducing the effects of stiction.

Electromechanical devices in accordance with the present disclosure may have any suitable structure. In various embodiments described herein, electromechanical devices may include two or more electrodes where two of the electrodes are separated by gap. In some cases, an elastically deformable layer occupies the gap that provides this separation. In some embodiments, the elastically deformable layer is substantially free of electrically conductive material. For instance, the elastically deformable layer may comprise a non-electrically conductive material (e.g., organic material, polymer, etc.), that is absent of additional conductive fillers (e.g., carbon/metal particles, etc.). It can be appreciated that the manner in which the device is fabricated and the manner of operation thereof may appropriately vary, largely dependent upon the overall structure of the device.

Figure 2:
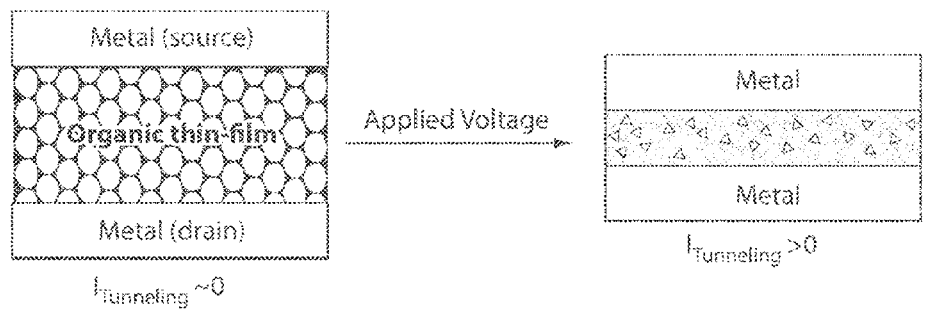
FIG. 2-4 depict various electromechanical device actuated between closed and open switch positions in accordance with some embodiments.

FIG. 2 illustrates an electromechanical device in accordance with the present disclosure having an elastically deformable layer, provided as an organic thin film that is sandwiched between opposing electrodes. Prior to application of an appropriate actuation voltage, the device is in an open switch position where little to essentially no appreciable current, whether through contact or through tunneling, flows between electrodes. However, upon application of a sufficient amount of voltage across the electrodes, subjecting the electrodes to an appropriate electrostatic force, the electrodes are brought closer to one another resulting in compression of the organic thin film.

Once the electrodes are brought sufficiently close to one another, while not placed in direct contact due to the presence of the layer in between the electrodes, a suitable tunneling current arises therebetween. As discussed further below, as electrodes are brought closer toward one another, the tunneling current increases exponentially. Accordingly, the extent to which the electrodes are compressed toward one another and, in turn, the electrical current through the thin film may be controlled, in large part, by appropriate adjustment of the applied actuation voltage.

As discussed above, when the device is in a closed switch position, the direct tunneling current that flows between the electrodes may be at least $10^6$ greater than the direct tunneling current that flows between the electrodes when the device is in an open switch position.

In some embodiments, when placed in a closed switch position, the current that flows between electrodes is greater than $10^{-8}$ A, greater than $10^{-7}$ A, greater than $10^{-6}$ A, greater than $10^{-5}$ A, greater than $10^{-4}$ A, greater than $10^{-3}$ A, greater than $10^{-2}$ A, greater than $10^{-1}$ A, greater than 1.0 A, between $10^{-8}$ A and 1.0 A, between $10^{-7}$ A and $10^{-1}$ A, between $10^{-6}$ A and $10^{-2}$ A, or between $10^{-5}$ A and $10^{-3}$ A. The current (e.g., tunneling) that flows between electrodes when the device is placed in a closed switch position may fall within ranges defined by any of the end points listed above, or may fall outside of the above-noted ranges.

Conversely, when the device is in an open switch position, the direct tunneling current that flows between the electrodes is negligible. In some embodiments, when placed in an open switch position, the current that flows between electrodes is less than $10^{-6}$ A, less than $10^{-7}$ A, less than $10^{-8}$ A, less than $10^{-9}$ A, less than $10^{-10}$ A, less than $10^{-11}$ A, less than $10^{-12}$ A, less than $10^{-13}$ A, between $10^{-6}$ A and $10^{-13}$ A, between $10^{-7}$ A and $10^{-12}$ A, between $10^{-8}$ A and $10^{-11}$ A, or between $10^{-9}$ A and $10^{-10}$ A. The current that flows between electrodes when the device is placed in an open switch position may fall within ranges defined by any of the end points listed above, or may fall outside of the above-noted ranges.

In general, the lack of contact between electrodes may also eliminate or otherwise reduce the possibility of cross-contamination between electrodes, for example, metal/particle transfer to an electrode from another electrode and/or other source.

It can be appreciated that electromechanical devices described herein are not required to be actuated by a voltage difference between electrodes. For instance, the electromechanical device may be compressed as a result of an externally applied mechanical pressure (e.g., clamp, lever, pressure application, manual compression, etc.).

While the elastically deformable layer disposed between electrodes may be easily compressed, in another aspect of the present disclosure, the elastically deformable layer may also provide for a suitable restoring force upon release of the applied actuation force/compression, for the device to recover to the original resting state, in an open switch position (switch is "off").

Figure 3:
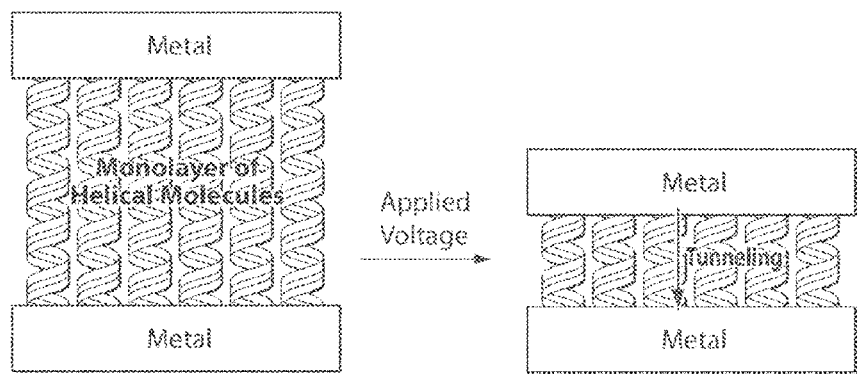

FIG. 3 illustrates another embodiment of an electromechanical device where the elastically deformable layer includes a monolayer of helical molecules (e.g., self-assembled monolayer). In some embodiments, molecules with such helical structures may exhibit a spring-like behavior. For example, helical molecules, or other suitable molecular structures, may be functionalized with a certain combination of chemical moieties that are thermodynamically unstable when in close proximity to each other. Accordingly, once the molecular layer is compressed, the respective functional groups will repel one another when in close proximity, so that the overall structure is able to transition and/or maintain a lower energy state. As a result, the resilient spring-like behavior of the elastically deformable layer may contribute to returning the device back to the open switch position upon removal of the actuation force. That is, inclusion of the elastically deformable layer is useful to avert stiction of the electrodes to one another upon release of the actuation force. The elastically deformable layer further prevents direct contact between the electrodes upon actuation of the device to the closed switch position.

Figure 4:
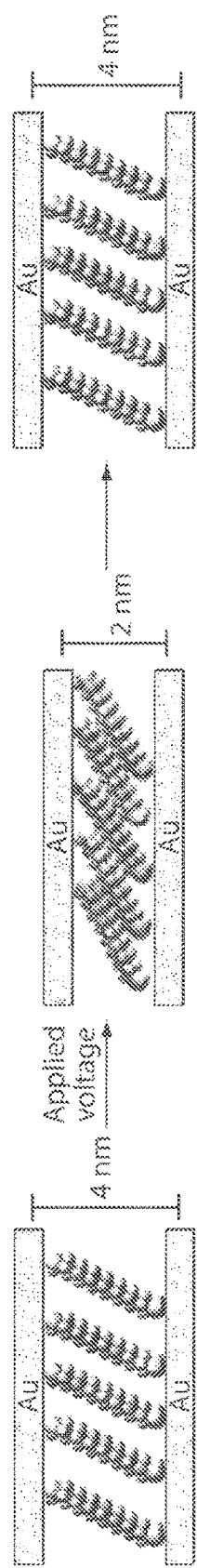

FIG. 4 depicts another example of an electromechanical device in accordance with embodiments presented herein. The device has two opposing electrodes with spring-like molecules disposed therebetween. In some embodiments, when actuating the device to an on-state (closed switch position), the separation distance of the gap is reduced from 4.0 nm to 2.0 nm, increasing the tunneling current in this device by several orders of magnitude. Such actuation allows the device to exhibit a desired abrupt switching behavior.

FIG. 5 shows various illustrative embodiments of electromechanical devices in accordance with the present disclosure. In particular, FIG. 5 depicts both vertically and laterally actuated devices. FIGS. 2-4 provide examples of vertically actuated devices where, for some cases, the electrodes and elastically deformable layer (e.g., organic thin film) reside along a plane that runs parallel to the plane of an underlying substrate (not shown), and the electrodes are actuated in a vertical direction, substantially perpendicular relative to the underlying substrate. On the other hand, in a laterally actuated device, for some instances, the electrodes and elastically deformable layer reside along a plane that runs perpendicular to the plane of an underlying substrate (not shown), and the electrodes are actuated in a lateral (horizontal) direction, substantially parallel relative to the underlying substrate.

Figure 6:
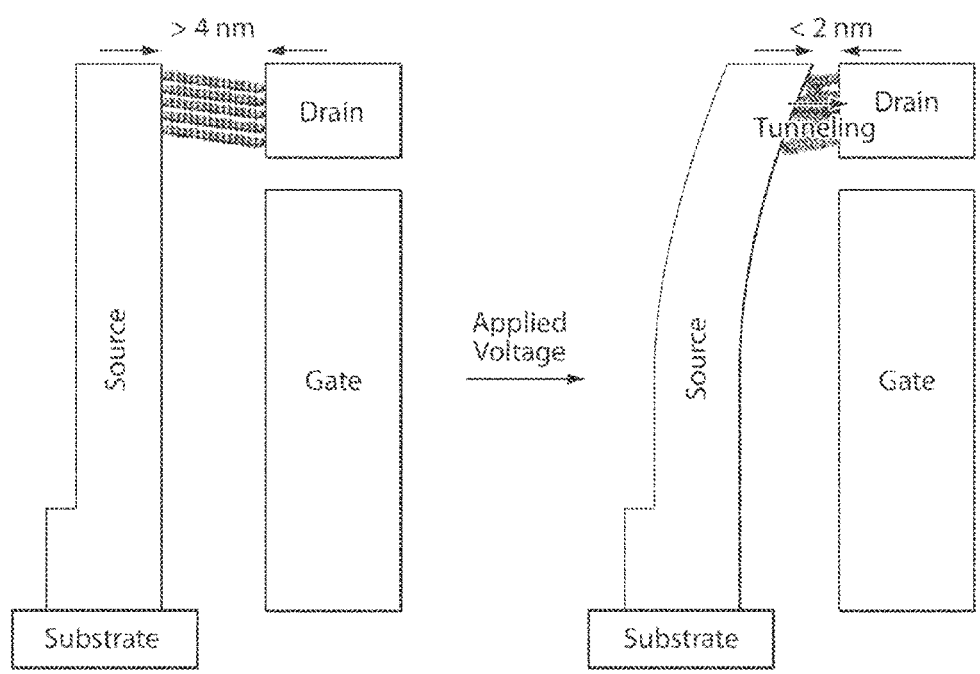
Figure 7:
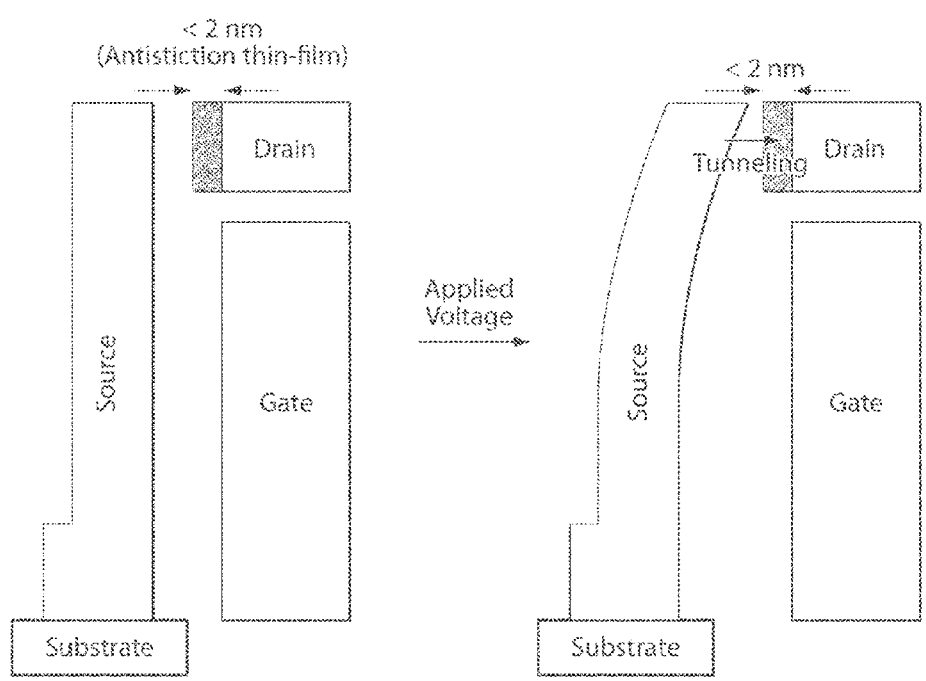

FIGS. 6-7 show illustrative embodiments of a laterally actuated electromechanical device having respective source, drain and gate electrodes. The source electrode is formed as a cantilever that is fixed at an underlying substrate on one end and free at an end closest to the drain electrode. The drain and gate electrodes may also be fixed to respective substrates (not shown). As depicted, while not necessary, the cantilever is disposed substantially equidistant to the drain and gate electrodes. As shown, an elastically deformable layer (e.g., organic thin-film, group of helical molecules, etc.) is sandwiched between source and drain electrodes at the end of the source electrode.

In FIGS. 6-7, when in the open switch position, the source electrode is disposed at a distance (e.g., greater than 4 nm) away from the drain electrode such that current is unable to flow therebetween. To actuate the device toward a closed switch position, an appropriate actuation voltage is applied to the gate electrode so as to cause deflection of the source electrode (e.g., through electrostatic force) toward the drain electrode. Such deflection reduces the separation distance of the gap between the respective source and drain electrodes. When the distance between the source and drain electrodes is sufficiently small, while not in direct contact, a suitable tunneling current is generated between the source and drain electrodes, through the elastically deformable layer, resulting in a closed switch position. The elastically deformable layer disposed between the source and drain electrodes exhibits spring-like behavior such that when the actuation voltage applied by the gate electrode is released, the source electrode returns back to its original open switch position.

FIG. 7 depicts an example of an electromechanical device that includes an elastically deformable layer provided as an approximately 1-2 nm thick layer between source and drain electrodes. The elastically deformable layer includes an anti-stiction material through which tunneling is able to occur when the electrodes are located sufficiently close to one another. Here, the anti-stiction material is provided on the surface of the drain electrode, however, such a material may also be provided on the source electrode, both electrodes, or another suitable location. While allowing for tunneling to occur therethrough, the presence of such a material may be suitable to prevent direct contact between the source and drain electrodes.

Figure 8:
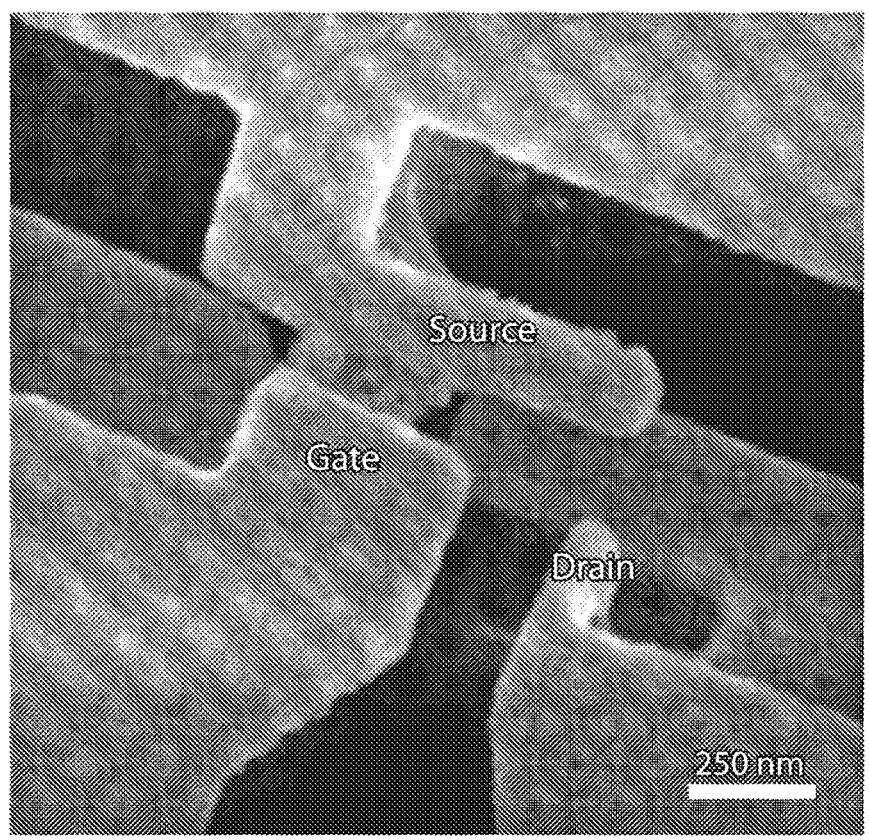
FIG. 8 shows a micrograph of an electromechanical device in accordance with some embodiments.

FIG. 8 shows a micrograph of a laterally-actuated cantilever device structure, similar to that of FIGS. 6-7. The device has a source electrode provided as a cantilever beam, a gate electrode and a drain electrode, each fixed to respective substrates. While the cantilever beam electrode is labeled as a "source" and the opposing electrodes are labeled as "gate" and "drain," respectively, it should be appreciated that any of these electrodes may be used as a source, gate or drain electrode, depending on how they are arranged and used with respect to one another.

In some embodiments, an elastically deformable layer is not required. For example, tunneling through a gap (e.g., nanoscale gap) between source and drain electrodes may be appropriately modulated using a cantilever-type structure, even in the absence of an elastically deformable layer. However, it can be appreciated that a suitable material, such as a group of spring-like molecules, anti-stiction coating and/or other appropriate layer may be incorporated on or adjacent the source and/or drain electrode(s).

Figure 9:
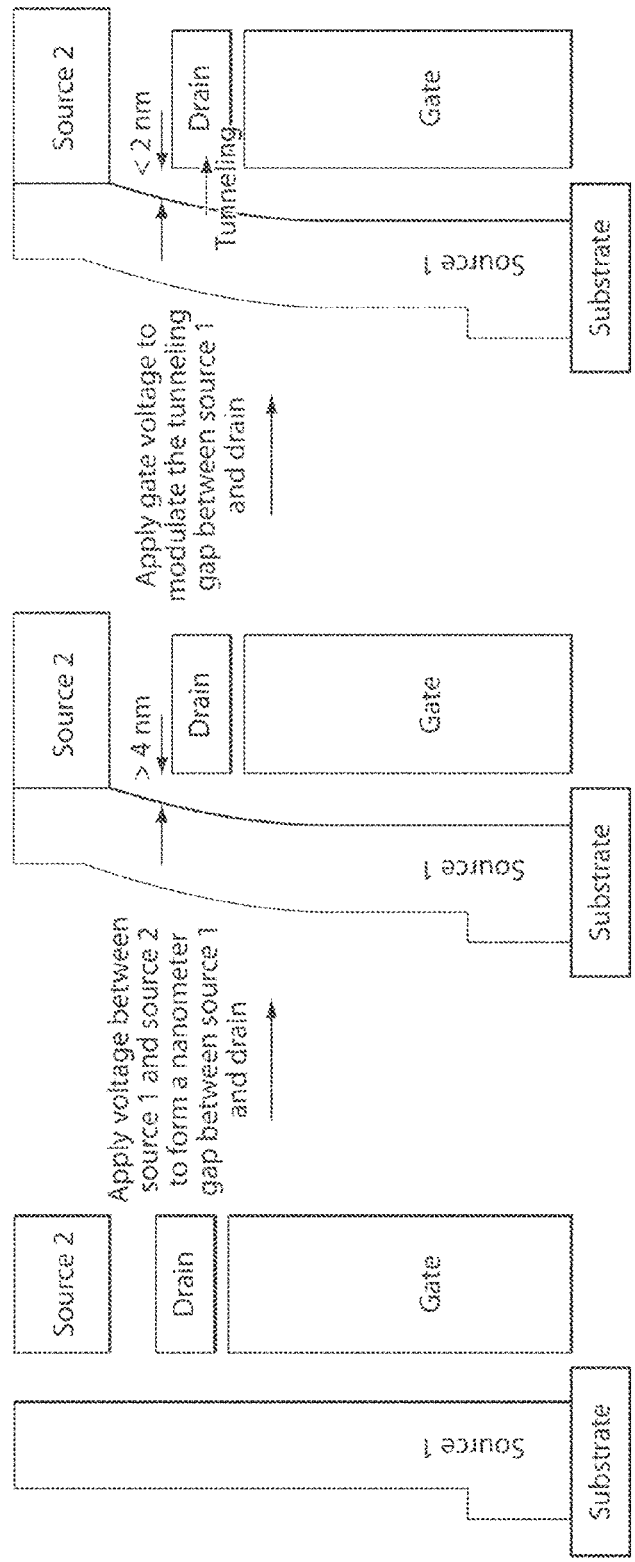
FIGS. 9-15 show further electromechanical device in accordance with some embodiments.

In some embodiments, cantilever/beam-based embodiments may be structured to include one or more additional electrodes that facilitate the formation of nanometer-thick gaps. For example, FIG. 9 depicts an illustrative embodiment of an electromechanical device having two source electrodes 1, 2, a gate electrode and a drain electrode. In this embodiment, when placed in a closed switch position, despite the source electrodes 1, 2 coming into mutual contact, the source and drain electrodes are prevented from direct contact with one another. The source electrode 1 is provided as a cantilever beam fixed to and extending from a substrate.

In operation, a voltage is applied between source electrodes 1, 2 so as to move the source electrodes 1, 2 toward one another, for example, via deflection of the source electrode 1. In various embodiments, upon direct contact, the source electrodes 1, 2 adhere to one another, permanently or temporarily. Though, in this example, when the source electrodes 1, 2 are placed in direct contact, the device may still remain in an open switch position, with no substantial off-state leakage current arising. For instance, as shown, when an appropriate actuation voltage is applied between source electrodes 1, 2, the distance between the source electrode 1 and the drain electrode may still be greater than 4 nm, or whatever distance is indicative of an open switch position. A gate voltage may then be applied, further deflecting the source electrode 1 so as to decrease the separation distance between the source electrode 1 and drain electrode further. When the source electrode 1 is brought sufficiently close to the drain electrode, a tunneling current indicative of the closed switch position arises between the source and drain electrodes.

As discussed above, the gap between source and drain electrodes may be filled with an elastically deformable material, for example, a compressible organic thin-film. Accordingly, the deflection of the cantilever/beam towards the drain will compress the molecular layer of the compressible organic thin-film, reducing the separation distance and exponentially increasing the tunneling current between electrodes. As a result, the presence of the molecular layer may mitigate direct contact between the electrodes during actuation, which helps prevent device failure due to permanent adhesion that may otherwise arise between electrodes. When the actuation force is released, the elastically deformable material may return back to its original thickness where the electrodes are in an open switch position.

Figure 10:
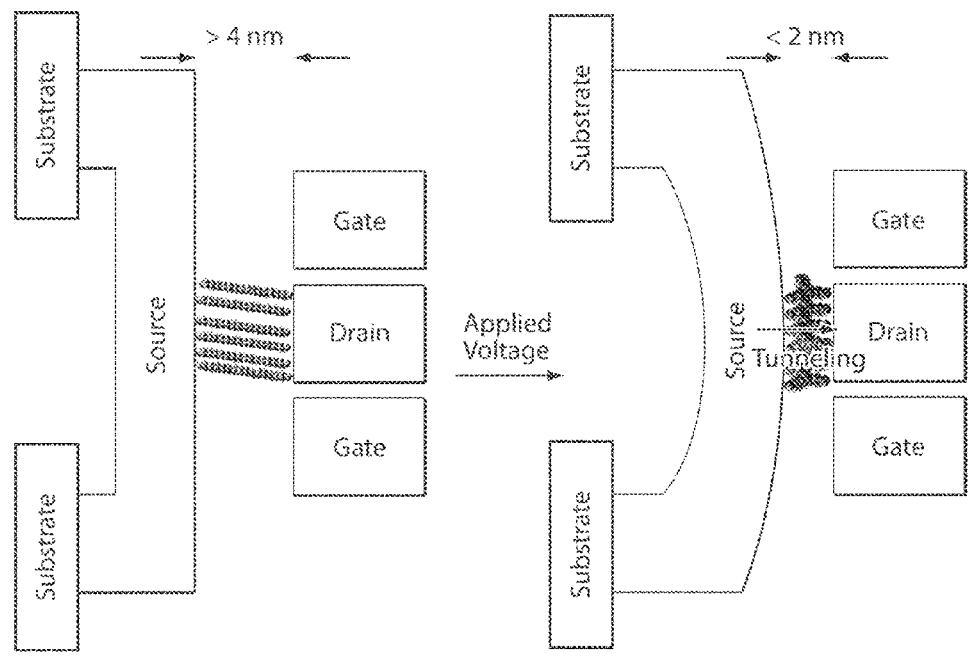

Clamped-clamped beam structures may apply a similar elastically deformable layer arrangement with respect to the presence of the elastically deformable layer as that presented in FIGS. 6-7. FIG. 10 shows an illustrative embodiment of an electromechanical device provided as a laterally actuated beam construction with an organic thin-film sandwiched between the source and the drain electrodes. In this example, the source electrode is fixed at opposite ends, in a clamped-clamped beam arrangement and the drain electrode is flanked on opposite sides by respective gate electrodes.

In FIG. 10, when in the open switch position, prior to the application of voltage from the gate electrodes, the separation distance between source and drain electrodes may be greater than a certain amount, such as greater than 4 nm. Though, as discussed above, application of a suitable voltage from the gate electrode(s) may cause deflection of the source electrode from the middle (e.g., due to electrostatic force). This deflection results in a reduction of the separation distance of the gap between the source and the drain electrodes. A sufficient degree of voltage applied from the gate electrode(s) leads to the modulation of tunneling current through the molecular layer, bringing the device to a closed switch position. In some embodiments, in a closed switch position, the separation distance between source and drain electrodes is less than 2 nm.

Figure 11:
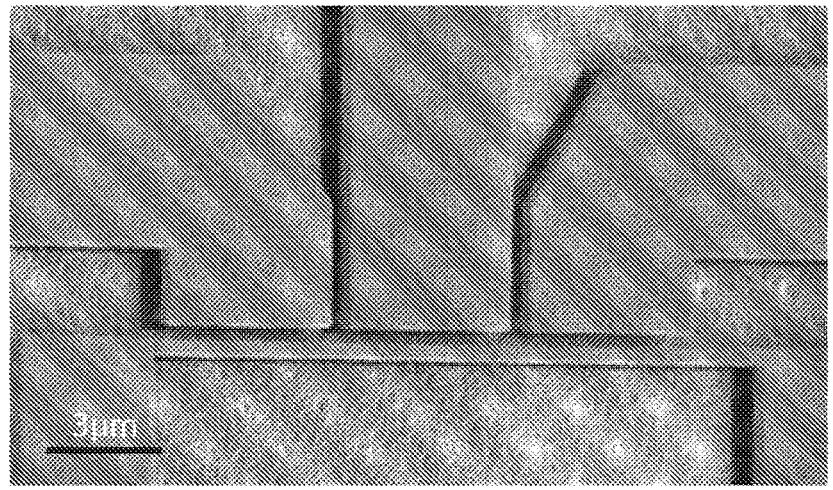
Figure 12:
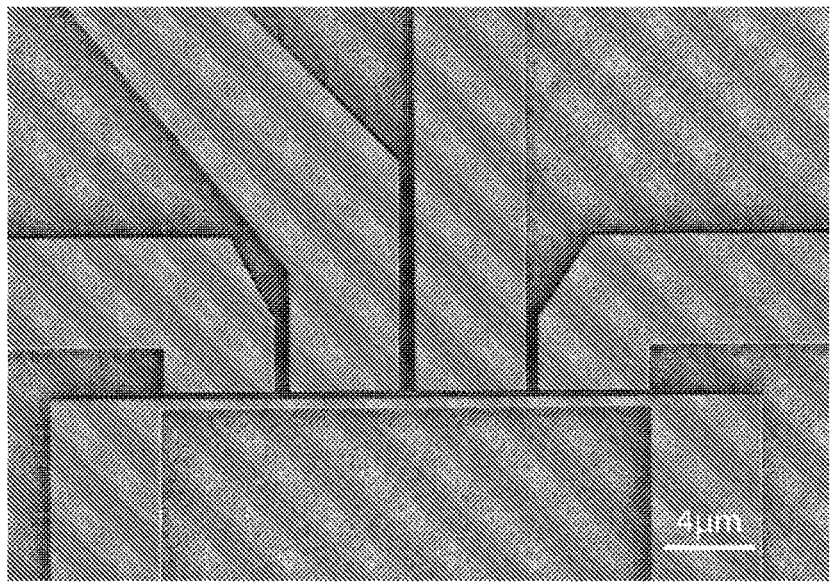

FIGS. 11-12 are micrographs of respective electromechanical devices that function in a manner similar to that discussed above for FIG. 10. That is, a relatively thin source electrode is fixed at opposite ends and respective drain and gate electrodes are disposed adjacent to the source electrode, between fixed regions. As shown in FIGS. 11-12, the devices are initially in an open switch position where the source electrode has yet to be deflected. However, when a suitable voltage difference is applied from one or more of the adjacent electrodes, the source electrode deflects so as to bring the device into a closed switch position.

Figure 13:
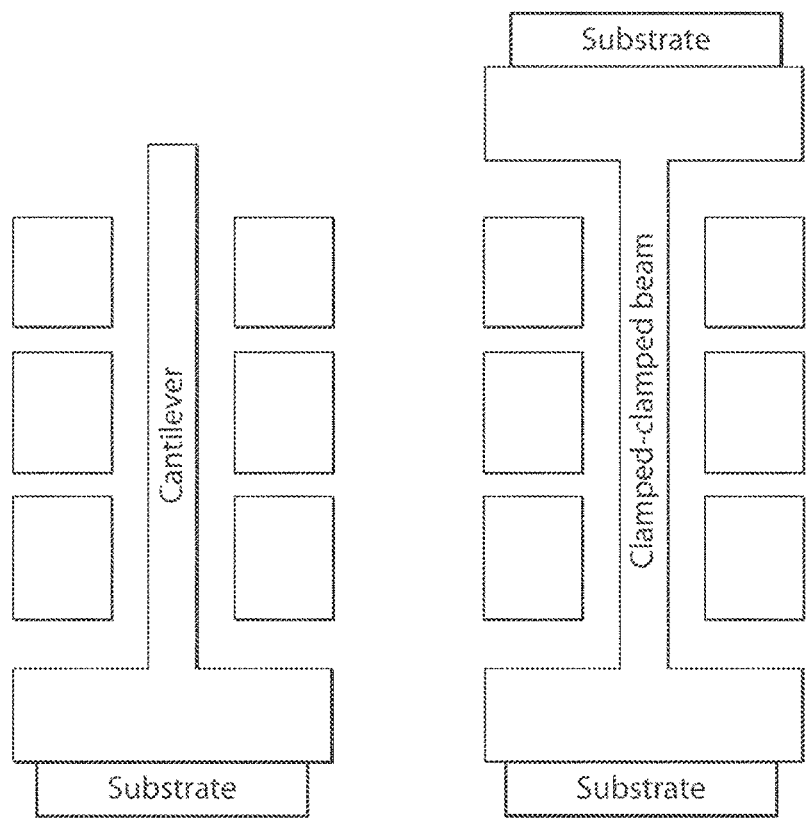

FIG. 13 illustrates various embodiments of electromechanical devices where various electrodes are placed on either side of a beam or cantilever. Such a structure may allow for the formation of multiple switching gaps based on how the cantilever or beam is deflected. In one embodiment, the device is arranged so that the source electrode has a cantilever beam structure, fixed to a substrate on one end. In another embodiment, the source electrode is arranged as a clamped-clamped beam that is fixed to substrates on opposite ends.

For both embodiments depicted in FIG. 13, drain and gate electrodes are disposed on either side of the source electrode. As a result, the source electrode may be deflected toward any of the surrounding electrodes in accordance with arrangements described herein. For instance, the source electrode may be caused to deflect in one direction (e.g., to the left in FIG. 13) by an electrostatic force induced by one or more gate electrodes on one side of the source electrode; or the source electrode may be caused to deflect in an opposite direction (e.g., to the right in FIG. 13) by a corresponding force induced by one or more other gate electrodes on another side of the source electrode. It can be appreciated that an elastically deformable material, such as an elastically compressible organic thin film and/or anti-stiction coating may be appropriately provided in a suitable manner between any of the electrodes.

Figure 14:
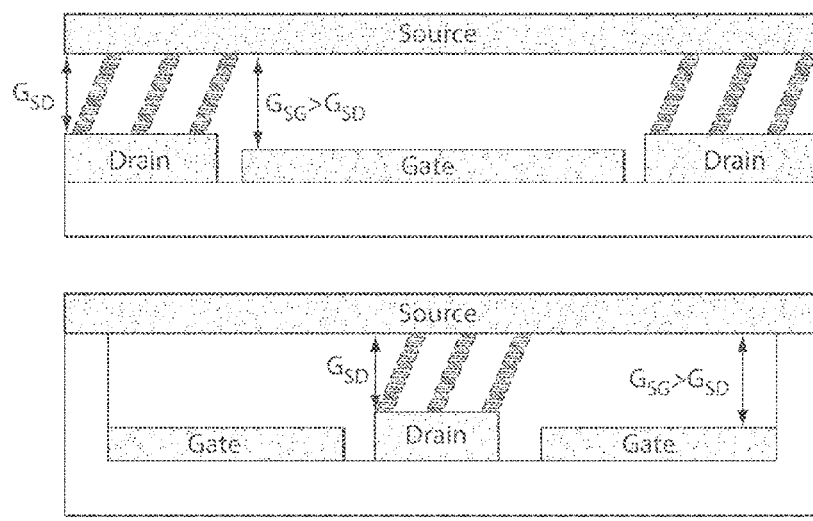
Figure 15:
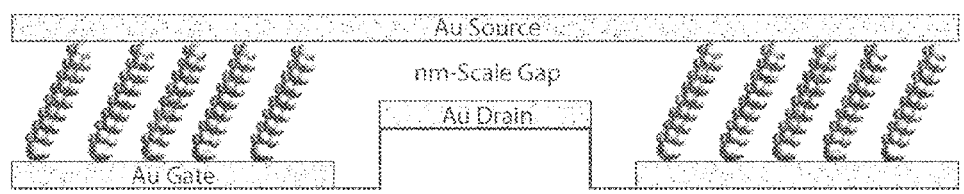

FIGS. 14-15 depict more illustrative embodiments of an electromechanical device having various configurations. As shown in FIG. 14, an elastically deformable layer (e.g., compressible organic film) occupies the gap between the source and drain electrodes. This gap is then modulated electromechanically by a voltage difference applied between the gate and source electrodes.

Structures of electromechanical devices in accordance with the present disclosure may employ a number of suitable configurations. For instance, as shown in the embodiments depicted in FIGS. 14-15, the gate-source gap is recessed to prevent undesirable tunneling occurrences; that is, the greater separation distance between the gate and source electrodes results in an overall reduction in off-state current. As shown, the separation distance provided by the gap $G_{SG}$ between the source and gate electrodes is greater than the separation distance provided by the gap $G_{SD}$ between the source and drain electrodes.

As discussed, for some cases, it may be preferable for the source electrode to be closer to the drain electrode than the gate electrode, so that upon application of a suitable actuation voltage and/or force, tunneling current consistent with the device being placed in a closed switch position arises between the source and drain electrodes prior to any such tunneling current of a similar magnitude between the source and gate electrodes. Accordingly, the gate electrode is used to attract the source and drain electrodes toward one another so that current flows therebetween, resulting in a closed switch between the source and drain electrodes.

In an embodiment of an electromechanical device, shown in cross-section on the left of FIG. 14, the source electrode is disposed opposite two drain electrodes and a recessed gate electrode. The drain electrodes flank the gate electrode on opposing sides. In addition, an elastically deformable layer is provided between one of the drain electrodes and a corresponding end of the source electrode, and another elastically deformable layer is provided between the other drain electrode and the corresponding opposite end of the source electrode.

In another embodiment of an electromechanical device, shown in cross-section on the right of FIG. 14, the source electrode is disposed opposite two recessed gate electrodes and a drain electrode. Here, the gate electrodes flank the drain electrode on opposing sides where, as discussed, the drain electrode is slightly elevated with respect to the surrounding gate electrodes. An elastically deformable layer is further provided between the drain electrode and the source electrode.

FIG. 15 illustrates a cross-section of yet another embodiment of an electromechanical device. The electrodes of this device are similar in structure to the embodiment provided on the right of FIG. 14 in that two gate electrodes flank the drain electrode on opposing sides. Yet in this particular case, the elastically deformable layer is provided between the source and gate electrodes, rather than between the source and drain electrodes. As shown, the elastically deformable layer is provided between one of the gate electrodes and a corresponding end of the source electrode, and another elastically deformable layer is provided between the other gate electrode and the corresponding opposite end of the source electrode.

As shown here, it can be appreciated that a elastically deformable layer may be provided at any suitable location. For instance, in some cases, while not shown, the elastically deformable layer may be provided between a source electrode and each of the drain and gate electrodes.

The elastically deformable layer may comprise any suitable material or combination of materials. In some embodiments, the elastically deformable material may exhibit a spring-like behavior, discussed below.

On the one hand, it may be preferable for the elastically deformable material to be relatively soft so that the electromechanical device is easily actuated, for example, using low operating voltage and energy. That is, the lower the stiffness of the elastically deformable material, the less voltage would be required to bring the electrodes sufficiently close and into a closed switch position. For example, application of a relatively low actuation voltage difference across electrodes (e.g., less than 1.0 V, less than 0.5 V, less than 0.3 V, less than 0.1 V), or suitable compressive actuation force, may be sufficient to actuate the device from an open switch position to a closed switch position. Though, as described above, for some applications, the voltage difference across electrodes for actuating the device from an open switch position to a closed switch position may be higher than 1.0 V.

It may also be preferable for the elastically deformable material to be sufficiently stiff so as to maintain separation of the electrodes in an open switch position, when desired. The greater the stiffness, or spring constant, of the elastically deformable material, the more voltage and/or force would be required to bring the electrodes into a closed switch position. That way, the elastically deformable material is able to hold the device in an open switch position, when suitable, such that the switch does not close unpredictably or give rise to an undesirable leakage current. Further, the spring-like behavior of the material may also provide a desirable restoring force to allow the device to abruptly turn off, to an open switch position, and also prevent contact stiction between the electrodes.

The elastically deformable material may also prevent electrodes (e.g., source and drain electrodes) from directly contacting one another when actuated to be in a closed switch position. For example, molecules of the elastically deformable material may aggregate together, filling spaces that may exist between electrodes. Accordingly, when positioned sufficiently close, electrons may tunnel through the elastically deformable material from one electrode to another. Thus, electromechanical devices described herein, electrically and/or force modulated, may allow for a suitable tunneling current to arise between electrodes. By preventing the electrodes from contacting one another, the electrodes are less prone to sticking when placed in a closed switch position, allowing for the device to exhibit repeatability of switching.

The elastically deformable material may exhibit any suitable mechanical properties. In some embodiments, the elastically deformable material may have a spring constant of less than 10.0 MPa, less than 9.0 MPa, less than 8.0 MPa, less than 7.0 MPa, less than 6.5 MPa, less than 6.0 MPa, less than 5.5 MPa, less than 5.0 MPa, less than 4.0 MPa, less than 3.0 MPa, less than 2.0 MPa, less than 1.0 MPa, etc. For example, the elastically deformable material may have a spring constant of between 1.0 MPa and 6.5 MPa, between 2.0 MPa and 6.0 MPa, between 1.0 MPa and 3.0 MPa, between 3.0 MPa and 5.0 MPa, or other ranges between end values provided herein. In some embodiments, the device may be used for relatively higher actuation voltage applications (e.g., up to 10.0 V for actuation), in which case the elastically deformable material may have a spring constant of less than 150.0 MPa, less than 120.0 MPa, less than 100.0 MPa, less than 90.0 MPa, less than 80.0 MPa, less than 70.0 MPa, less than 60.0 MPa, less than 50.0 MPa, less than 40.0 MPa, less than 30.0 MPa, less than 20.0 MPa, less than 10.0 MPa, etc. For example, the elastically deformable material may have a spring constant of between 1.0 MPa and 100.0 MPa, between 5.0 MPa and 50.0 MPa, between 10.0 MPa and 20.0 MPa, or other ranges between end values provided herein. It can be appreciated that the elastically deformable material may exhibit a spring constant that falls outside of the above-noted ranges. The stiffness of the elastically deformable material may be measured by methods known in the art, for example, by current-voltage extrapolation, interferometry measurements, atomic force microscopy, or other suitable techniques.

Without wishing to be bound by theory, a device incorporating an elastically deformable material having a generally low stiffness (e.g., low packing density, material with low cross-link density, relatively soft material, etc.) may allow for the device to have a relatively low actuation voltage. On the other hand, the actuation voltage for bringing the electrodes in close enough proximity for tunneling to occur may be comparatively higher for an elastically deformable material that exhibits an otherwise greater degree of stiffness.

FIGS. 16-19 provide examples of elastically deformable materials, or organic thin film molecules, that may be incorporated in electromechanical devices described herein. In some embodiments, elastically deformable materials may include a non-conductive material, such as a non-conductive organic material (e.g., polymer, organic thin film).

In some embodiments, the elastically deformable material may include molecules that form a self-assembled monolayer (SAM), such as polyethylene glycol dithiol, fluorinated alkanethiol, or any other suitable molecule. Thiol groups may be employed so as to form a covalent bond with one or more electrodes, for attachment thereto (e.g., via gold-sulfur bond). For example, in some cases, polyethylene glycol dithiol may be employed so as to form respective bonds with both electrodes positioned opposite one another.

Self-assembled monolayers may be suitably tailored to have different lengths so as to adjust the overall stiffness of the thin film. For example, a longer, more functionalized polymer chain may be less stiff than, for example, a shorter alkyl or other polymer chain. That is, longer chains may have more of a tendency to take on multiple conformations, such as by folding over themselves, which may result in a lower stiffness. In comparison, shorter molecular chains may have substantially fewer conformations available, hence, making such chains more resistant to deformation, and generally stiffer. Though, for some cases, the material is more likely to be stiffer (despite having long-chained molecules) when the chains are more densely packed.

In some embodiments, molecules making up the elastically deformable material (e.g., self-assembled monolayers) may have a length of at least 1 nm, at least 2 nm, at least 3 nm, at least 4 nm, at least 5 nm, at least 7 nm, at least 10 nm, or other suitable length. Or, the molecules may have a length of less than 25 nm, less than 20 nm, less than 15 nm, less than 10 nm, or less than 5 nm, etc. The molecules of the elastically deformable material may have a length that falls within ranges defined by any of the end points described above, or may fall outside of the above noted ranges.

As noted herein, the density of the molecules in a self-assembled monolayer may also be appropriately tailored. For example, a self-assembled monolayer may have a relatively low packing density, allowing the organic layer to exhibit a suitably low stiffness. In some embodiments, the packing density of a self-assembled monolayer for an elastically deformable material may be between 20% and 80%, between 30% and 70%, between 40% and 60% (e.g., approximately 50%), etc., or suitable for the elastically deformable material to compress in an appropriate manner.

It can be appreciated that such molecules may also have functional groups that will affect their overall stiffness. For instance, in some cases, fluorinated alkane thiol molecules may be employed, resulting in relatively straight molecular chains due to mutual repulsion of fluorine atoms from one another. Such self-assembled monolayers may be formed using a mixture of fluorinated thiols and semifluorinated dithiols, such as those shown in FIGS. 17-18.

Approaches in accordance with the present disclosure may give rise to a self-assembled monolayer that has a relatively dense collection of fluorine atoms on one side with a sparsely packed alkyl self-assembled monolayer located on an opposite side. The densely packed fluorous region may be relatively rigid, stabilizing the self-assembled monolayer so as to promote self-assembly. The sparse alkyl portion, on the other hand, may allow for compression of the overall layer. As alkyl and perfluoroalkyl molecules exhibit generally unfavorable intermolecular forces (repulsive) with respect to one another, the open switch position of the device will be thermodynamically favored. In other words, when the device is actuated to a closed switch position, where alkyl and perfluoroalkyl molecules are bunched together, the repulsive nature of the molecules promote recovery, allowing the open switch position to be restored upon removal of the actuation voltage/force.

In some embodiments, the elastically deformable material may include an evaporated or spin-coated organic layer, such as triptycene, dibenzocyclooctatetraene, or any other suitable molecule. Such molecules may exhibit generally 3D structures, which may naturally nestle amongst one another as the thin film is squeezed or otherwise compressed. These materials may also have properties such that the tunneling barrier between electrodes changes when the molecule is compressed. For example, the tunneling barrier threshold therethrough may be substantially lowered upon compression of the molecule(s). In such cases, despite the possibility for the molecule(s) of the elastically deformable material to be relatively stiff, the molecule(s) may undergo a conformational change upon compression, resulting in a substantial tunneling current to arise between electrodes.

Figure 17:
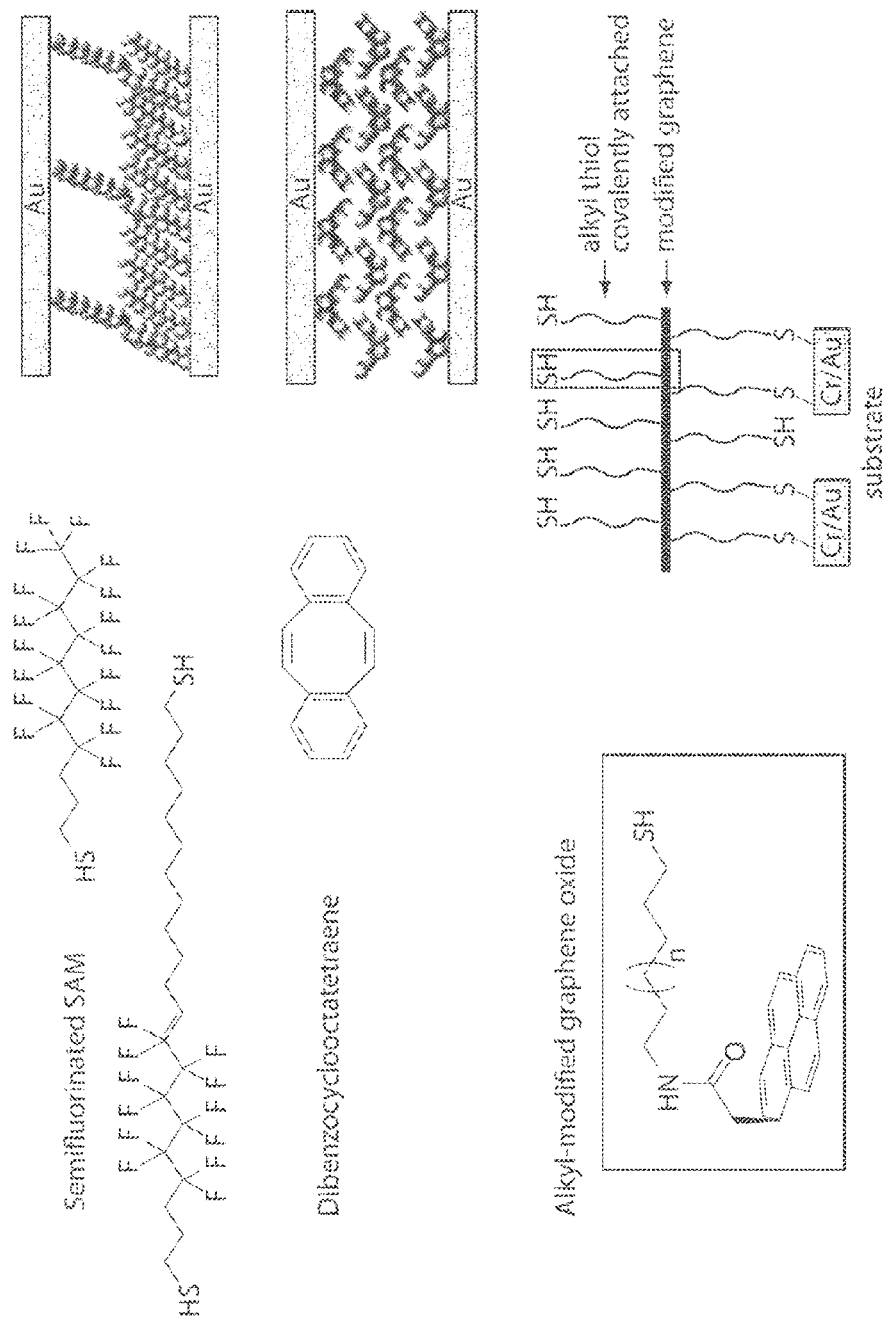
Figure 18:
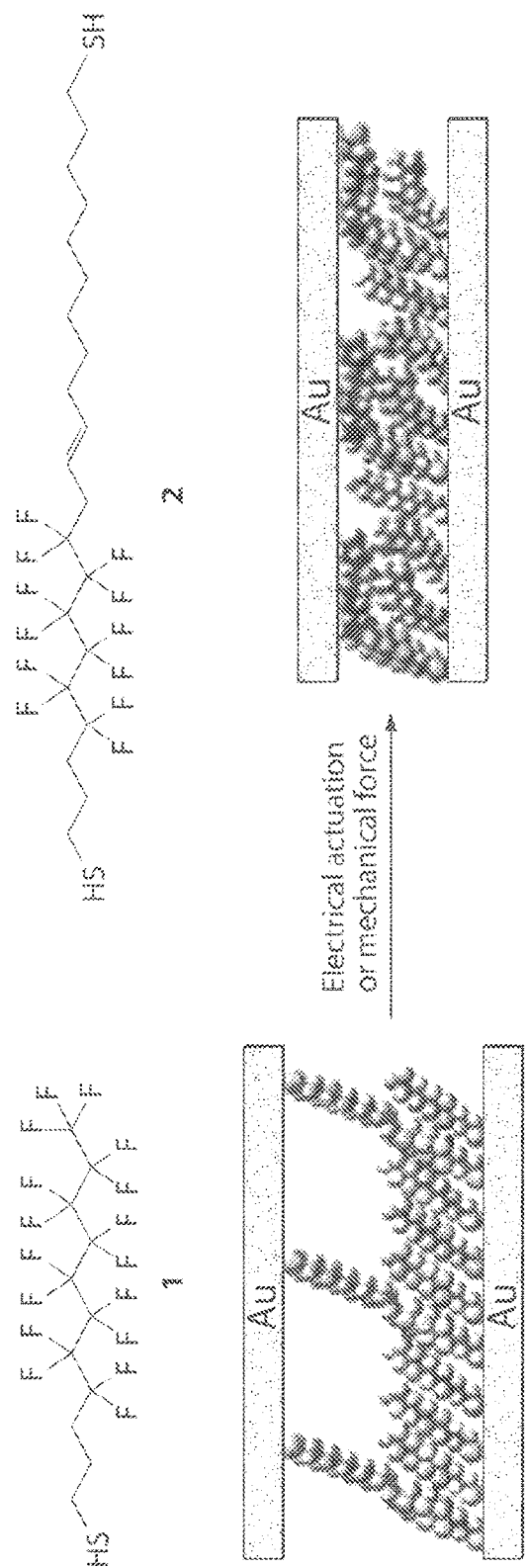

Dibenzocyclooctatetraene (dibenzoCOT), shown in FIGS. 17 and 19, is a small-molecule, which takes on an arched, tub-like shape in its ground state so as to avoid an unfavorable anti-aromatic thermodynamic state. However, dibenzoCOT can be forced to a substantially flattened anti-aromatic state as also shown for the embodiment of an electromechanical device of FIG. 19. This results in a conformational change in structure where a significant restoring force is generated due to the chemical instability of the anti-aromatic system.

As shown in the embodiment of FIG. 19, when the electrodes are brought closer together, the tunneling length therebetween decreases. When the elastically deformable layer includes dibenzoCOT, the tunneling barrier may be further decreased, as dibenzoCOT, in a compressed flat state, may allow for the overlap of delocalized cyclic $\pi$-systems. That is, the compressed dibenzoCOT may allow for a greater amount of current therethrough than when in the arched tub-like shape. Accordingly, when compressed, the presence of dibenzoCOT may increase the total current between electrodes as they are brought closer together.

Among other small organic molecules that may be used to develop electromechanical devices in accordance with the present disclosure are tris-(8-hydroxyquinoline)aluminum (alq3), triptycene and triptycene derivatives. The chemical structures of these molecules may give rise to a tendency for the molecules to form thin-films having a relatively low packing density. When such molecules exhibit a low packing density, the formed layer may possess a relatively low stiffness, allowing for low voltage actuation of the device from open to closed switch positions.

The elastically deformable material may include any other suitable composition. In various embodiments, the elastically deformable material may include dendrimers (e.g., repetitively branched molecules often substantially symmetric around a core), star polymers, biopolymers (e.g., collagen, carbohydrates, peptides, etc.), hydrogen-bonded matrices, organic nanoparticles, modified carbon nanotubes, redox-sensitive polymers, or other appropriate material.

It should be understood that the elastically deformable material is not limited to the compositions discussed herein, as the use of other suitable compositions are within the scope of the present disclosure.

In some embodiments, the electromechanical device is free of a semiconducting substrate. Or, in various embodiments, the substrate provides only a mechanical foundation. While silicon and other semiconducting materials may provide this foundation, their natural conductivity may also contribute to an undesired stray capacitance and loss to circuits upon which such materials are built. Accordingly, electromechanical devices described herein may be generally robust against radiation damage, offering long-term operability.

In some embodiments, the substrate upon which an electromechanical device in accordance with the present disclosure is disposed is substantially non-conductive. For example, the substrate may be an insulator such as glass, alumina, quartz or sapphire.

Electromechanical devices may be fabricated in accordance with any suitable method. In general, as such devices may have submicron dimensions, fabrication of such devices may involve nanoscale-precision. In various embodiments, a combination of atomic layer deposition, electron-beam lithography, metal evaporation and/or other suitable techniques may be used to form each of the source, gate and drain electrodes. Organic thin-films, molecular monolayers and/or other elastically deformable layers may be formed using self-assembly, evaporation, spin-coating, dip-coating of the organic molecules and/or other suitable techniques.

Figure 20:
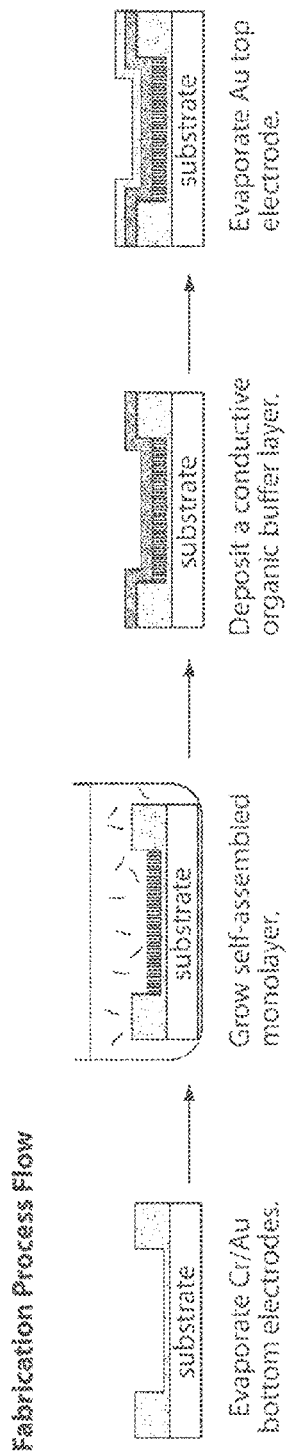
FIGS. 20-24 depict various fabrication processes for electromechanical devices in accordance with some embodiments.

FIG. 20 depicts an illustrative embodiment of a process flow for fabricating electromechanical devices described herein. As shown, a first electrode (e.g., lower electrode) formed of a suitable conductive material (e.g., metal, Cr, Au, Ag, non-metallic conductive material, etc.) may be deposited (e.g., thermally evaporated) on to a substrate. As discussed above, the substrate may include any suitable material and, in some cases, may be an insulative material (e.g., non-conducting, non-semiconducting). The first electrode may be patterned on to the substrate, for example, through use of a shadow mask, or a conventional/electron-beam lithography step followed by lift-off, depending on the dimensions required.

An organic thin film may be subsequently deposited on to the surface of the conductive electrode(s) as an elastically deformable layer. Depending on the molecule(s) used, this film can be formed as a self-assembled monolayer (e.g., thiolated molecules, PEG-dithiol, etc.), such as by thermal evaporation, spin-coating and/or dip-coating using small crystalline molecules. To allow for self-assembly, a substrate covered with the patterned lower electrode(s) may be placed in a solution of desired molecules (e.g., thiol molecules) where a sufficient amount of time is allowed for the self-assembly to be completed.

In some embodiments, a conductive organic buffer layer (e.g., SpTPD, PEDOT:PSS) may be deposited on to the self-assembled monolayer having been formed on the electrode(s). The buffer layer may be useful to mitigate undesirable effects that may be associated with subsequent deposition of the second electrode (e.g., upper electrode). For instance, if the second electrode is evaporated over the self-assembled monolayer at a relatively high temperature, without the prior deposition of the buffer layer, the self-assembled monolayer could be damaged by the high temperature evaporation. Further, if the self-assembled monolayer is thin and/or sparse, conductive particles (e.g., metal particles) deposited thereon may have a tendency to penetrate through the layer, causing electrical shorts and lowering device yield. Thus, incorporation of a buffer layer may be useful to substantially prevent penetration of the conductive particles into the organic layer, improving overall device yield and performance. A second electrode (e.g., upper electrode) may then be deposited over the buffer layer, for example, via thermal evaporation.

Two challenges that may arise in the fabrication of electromechanical devices described herein are in the formation of relatively sparse SAMs and the installation of an upper electrode on the SAMs. An alternative approach to fabricating electromechanical devices in accordance with the present disclosure may be through use of graphene (or graphene oxide) upper electrodes, for example, using an electrostatic layer-by-layer assembly.

Figure 21A:
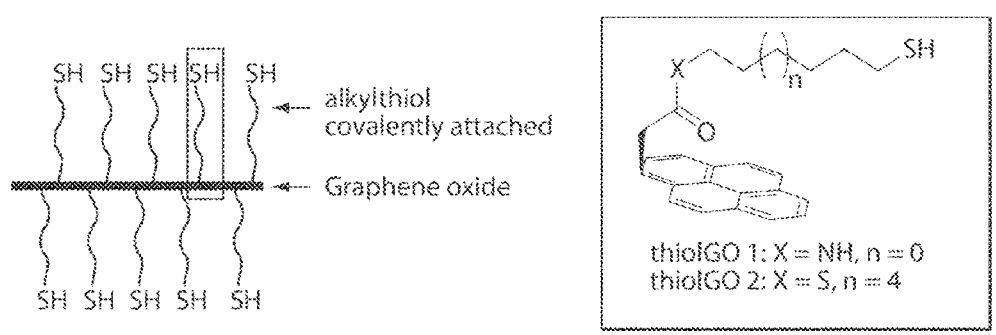
Figure 21B:
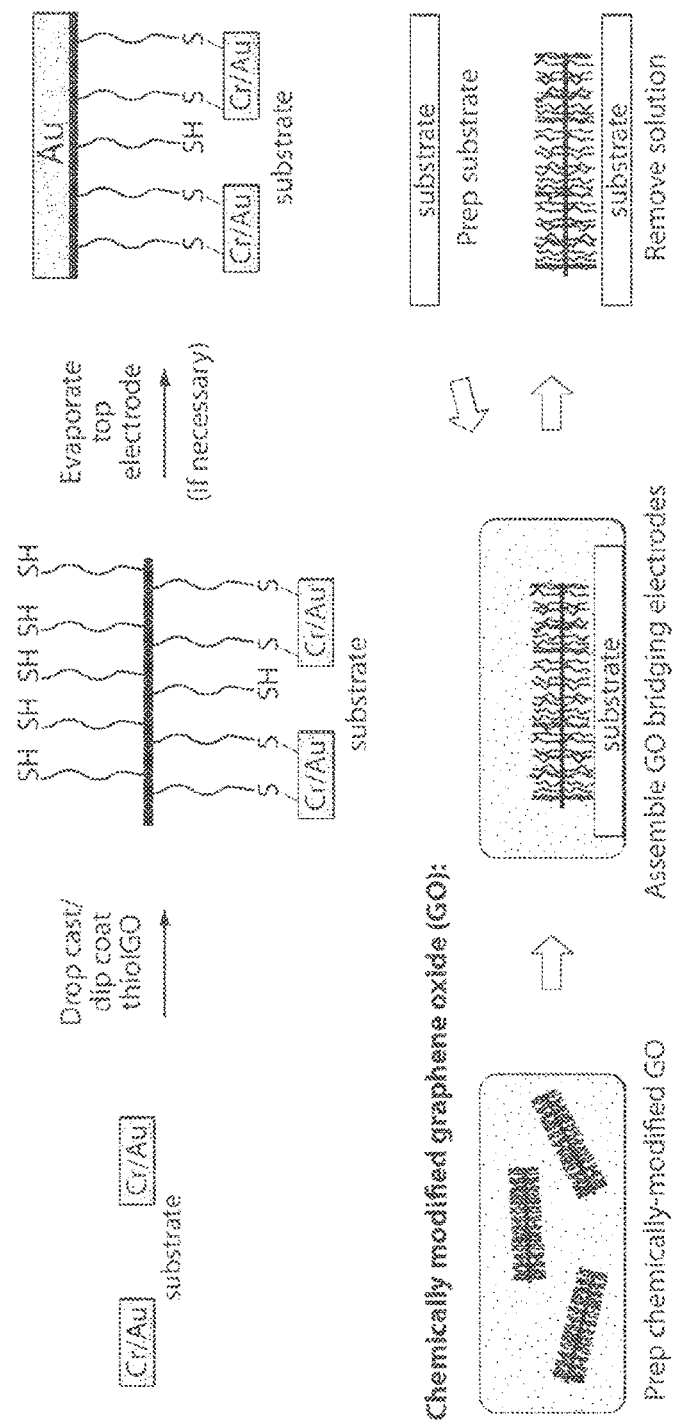

In some embodiments, the elastically deformable layer may be provided as an organic thin film formed simultaneously with the upper electrode, for example, by utilizing self-assembling of chemically modified graphene or graphene-oxide (GO) sheets onto the lower electrode(s). For example, as shown in FIG. 21, using techniques known to those skilled in the art, GO, having a planar conformation, may be covalently functionalized on opposing sides with alkyl thiol groups to yield thiolGO. The density of alkyl thiol groups on the GO can be suitably varied by changing the conditions of the chemical reaction (e.g., adjusting the incubation time, concentration of alkyl thiol molecules, etc.). Thus, control of the density of molecules allows for direct control of the stiffness of the material.

The thiolGO molecules can further be chemically modified (e.g., reduced) to yield a graphene upper electrode that enhances overall conductivity of the system. In the fabrication scheme based on a self-assembled upper electrode, the functionalized GO (or graphene) may be drop-casted or dip-coated onto the lower electrodes, which may have been fabricated, for example, by printing, electron-beam lithography, etc.

In some embodiments, the functionalized GO (or graphene) forms a bridge across separate electrodes patterned on the substrate. Due to the presence of thiol groups, a suitable amount (e.g., approximately 1 $\mu m^2$) of GO (or graphene) adheres to the gold lower electrodes, as shown in FIG. 21, forming the required metal-molecule-metal junction. The GO sheet can then be used as a protective buffer layer on which a metal upper electrode may be evaporated, if preferred. Or, the GO sheet itself may be employed as an electrode.

Figure 22:
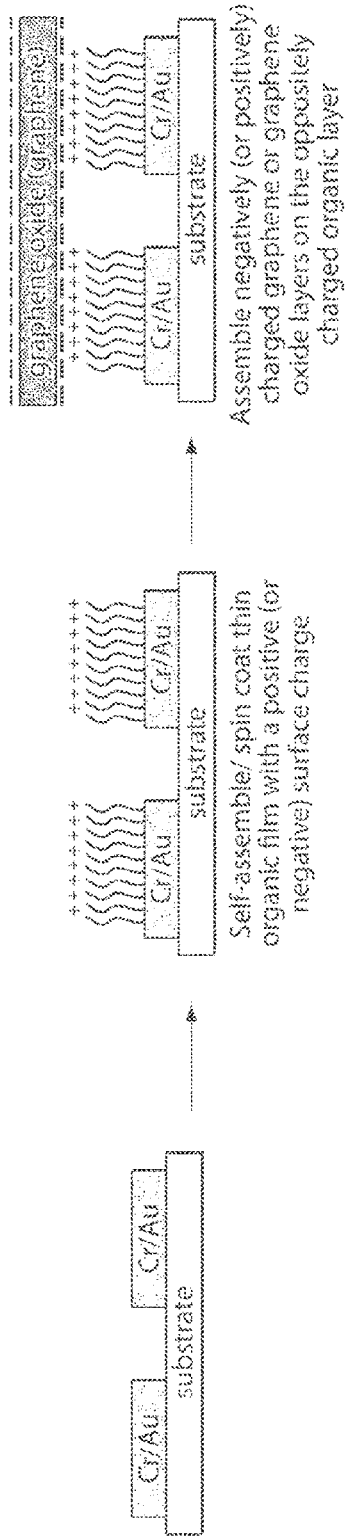

As further depicted in FIG. 22, in various embodiments for fabricating an electromechanical device, an organic thin film (e.g., self-assembled molecular layer) is formed on patterned lower Cr/Au electrodes. On an end opposite the metal electrode(s), the molecular layer presents a surface charge (shown as a positive charge in FIG. 22). Graphene (or graphene oxide) layers are chemically modified to acquire an opposite charge (shown in FIG. 22 as a negative charge) to that surface charge presented by the layer of molecular chains. The oppositely charged molecular layer and graphene (graphene oxide) sheets attract one another, promoting the formation of uniform graphene layers over the organic film creating a metal-molecule-metal junction that forms a bridge across the two lower electrodes. Application of a subsequent actuation voltage and/or force between the lower electrode(s) and the graphene results in compression of the organic thin film. The reduction in the separation distance provided by the gap between upper and lower electrodes results in an exponential increase in tunneling current, turning on the switch.

In some embodiments, the upper electrode(s) may be deposited through a suitable printing technique (e.g., nano-transfer printing). For example, once an elastically deformable layer (e.g., organic thin film) is suitably deposited on a lower electrode, a transfer pad or stamp may be used to apply the upper electrode(s). In some cases, the upper stamped electrode may be composed of Au, Ag, graphene, or other suitably conductive material.

Figure 23:
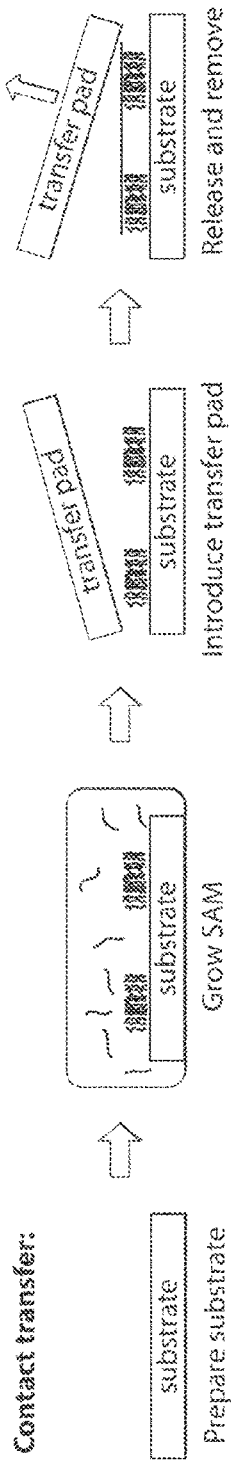

FIG. 23 depicts a schematic of an embodiment where an elastomeric stamp covered with a thin-film of a desired conductive material (e.g., metal) is utilized to stamp the conductive material onto the organic thin film, which has already been formed on the lower electrode (e.g., metal substrate). Nano-transfer printing is a low temperature approach that would not damage or otherwise adversely affect the molecules of the organic thin film upon application of the upper electrode. Further, such a process would not require a buffer layer and, hence, may allow for the formation of direct metal-molecule junctions.

Figure 24:
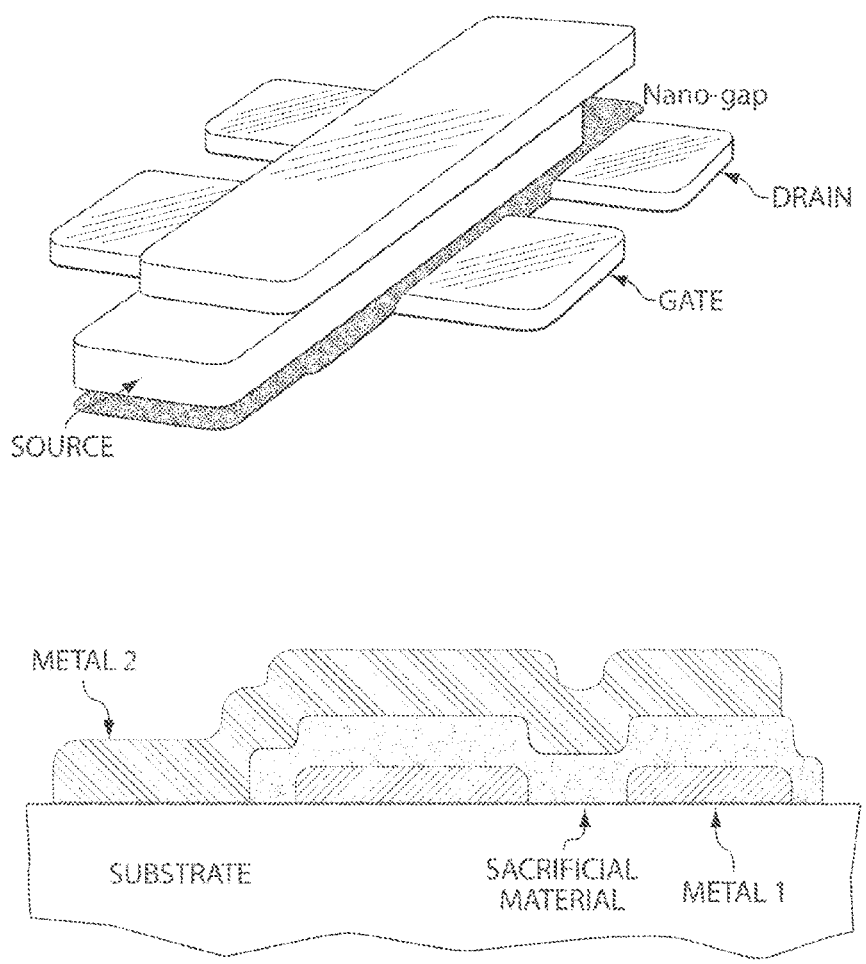

As noted above with respect to FIG. 9, it is not necessary to employ a molecular layer to support the tunneling gap between electrodes. FIG. 24 shows another example of an electromechanical device that does not require an elastically deformable layer to be incorporated therein. As shown, a cantilever beam source electrode is provided over respective gate and drain electrodes. The drain electrode is located closer to the free end of the cantilever beam and the gate electrode is located closer to the fixed end. A voltage applied between the gate and source electrodes will cause the beam to bend, thereby closing the drain-source gap so as to permit drain-source tunneling. The location of the gate-source gap is at or near a damped point of the beam, which is also closer to the fixed end of the beam, thus, this gap would not close sufficiently to permit tunneling between the gate and source electrodes.

While the force exerted by a drain-to-source voltage may cause the beam to deflect, the effects of that force can be reduced or otherwise minimized by making the drain electrode narrow. That is, the gate electrode may be thicker than the drain electrode, so that the gate electrode attracts the source electrode with greater force as compared with that of the drain electrode. As a result, it is less likely that the source and drain electrodes come into direct contact during use.

As discussed above, a recessed gate may be employed, resulting in a wider initial gate-to-source gap, to minimize the chance of undesirable tunneling between the gate and source electrodes.

In general, various tunneling devices described herein provide a continuum of possible units of operation between blocking and supporting tunneling currents, where the devices are able to act as electronically controlled conduction valves and/or switches, much like a common transistor or other electrical element. Thus, any of the structures provided herein may be used to implement both digital and analog circuitry.

Referring back to FIG. 24, such an embodiment of an electromechanical device may be fabricated according to a four-step procedure. The first step involves the deposition and patterning of the Metal-1 gate and drain electrodes. The second step involves the deposition and patterning of a sacrificial material that holds the place of the tunneling gap. The third step involves the deposition and patterning of the Metal-2 source cantilever electrode. The fourth and final step involves an under-cut removal of the sacrificial material to release the cantilever. Note that the Metal-2 layer can also be used for interconnecting bridges so as to permit two-level circuit wiring.

Figure 25:
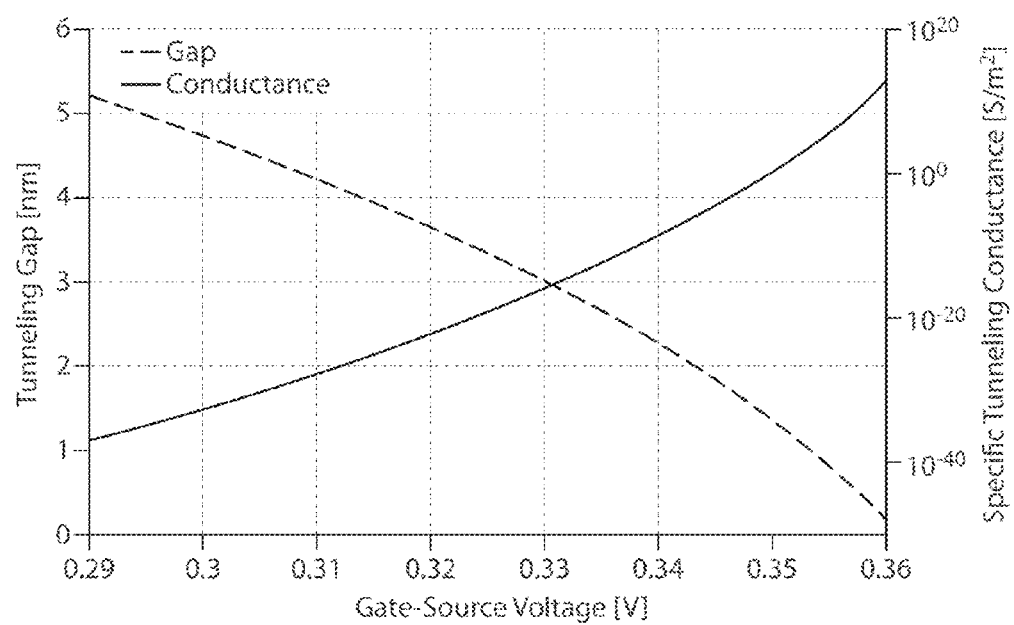
FIG. 25 shows a graph of the dependence of tunneling gap and conductance on gate-source voltage, for an example of an electromechanical device.

As such, a cantilever as shown in FIG. 24 may be fabricated with sufficiently planar, smooth and narrow gate-to-source and drain-to-source gaps. FIG. 25 shows the performance expected from an example valve/switch constructed with gold electrodes, actuated by a gate-source voltage. The dashed curve represents the drain-to-source tunneling gap and the solid curve represents the normalized drain-to-source conductance of an example tunneling nanoelectromechanical system analog valve. Here, the gap and conductance are both computed at the free end of the cantilever. The conductance is normalized to the cross-sectional area of the tunneling gap. As the gate-source voltage increases, the tunneling gap between electrodes decreases and the tunneling conductance increases significantly. It is noted that near the gate-to-source voltage of 0.35 V, the transconductance is approximately 60 decades per 60 mV, which far exceeds the gain of a semiconducting transistor.

It is further noted that the cantilever deflection grows inversely with the cube of the cantilever thickness, and so the useful operating voltage can be made considerably smaller with nanofabrication materials and processes that permit thinner cantilevers. In the example of FIGS. 24-25, the source cantilever is 5 microns long and 100 nm thick, and rises 10 nm above the gate and drain electrodes when not deflected. The gate electrode extends 2 microns out from the fixed clamped end of the cantilever beam. The drain electrode is constructed to be relatively narrow and centered beneath the free end of the cantilever.

As depicted in FIG. 25, tunneling conductance may increase significantly as the gaps close from approximately 4.0 nm to 1.0 nm. Consequently, for some embodiments, an open gap of perhaps 5-10 nm represents an open switch position. It thus follows that nanometer-scale roughness may be preferable for the interior gap surfaces. To reduce any undesirable gate-to-source turn-on voltage, a narrow gap and a long thin (out-of-plane) cantilever may be employed. Since the gap separation may be set by tunneling requirements, the mechanical design of the cantilever may provide for relatively low-voltage operation.

In some embodiments, metal cantilevers having a 100 nm thickness (out of plane) and a length of 1-10 microns may be suitable. The aspect ratio of the length-to-gap-separation may allow for the cantilever to be substantially planar. In some cases, the width (in plane) of the cantilever may be near 10% of the cantilever length, so as to facilitate undercut release during fabrication.

In some embodiments, for example, the fabrication of a 5-10 nm gate/drain-to-source gap may involve the use of a sacrificial material that is etched away after the deposition of Metal 2. To avoid typical sticking associated with a wet-etch release, a suitable material, such as polysilicon, may be used as a sacrificial material. Polysilicon may have advantages in that it can be anisotropically etched and even deeply undercut in a XeF2 plasma. Polysilicon can be deposited in layers down to perhaps 100 nm, which is too thick for the desired gap. However, following its deposition, polysilicon can be oxidized slowly in a dry atmosphere at low temperatures. This should permit the timed oxidation of all but the last 10 nm of polysilicon. The oxidized polysilicon is removed with HF leaving a 10 nm layer of sacrificial polysilicon. If the polysilicon cannot be reliably thinned using this technique, then the wet etch of one of many sacrificial materials, ranging from metals to organics, may be employed.

If the wet etchant, as it dries, draws the cantilever towards the substrate through its surface tension so as to promote sticking, the etchant may be rinsed with a mixture of water and alcohol that is ultimately frozen before drying. Sublimation may then be used to remove the frozen rinse agent without attracting the cantilever to the substrate.

To maintain cantilever planarity once the cantilever is released from the sacrificial material, the internal stress that develops in Metal 2 during its deposition may be managed. For example, during or after deposition, Metal 2 may be annealed with slow thermal relaxation to minimize and/or eliminate the stress internal to Metal 2. Or, a thin secondary metal may be deposited over Metal 2 to trim/cancel the original internal stress. That is, an original compressive stress may be trimmed with tensile stress, and/or vice versa. Or, an alternative valve design may be employed in which the cantilever is clamped on both ends to form a bridge. In this case, symmetric gates under both ends of the bridge may pull the bridge down towards a central drain.

In some cases, the rate at which gate charge can be varied may be several orders of magnitude faster than the mechanical resonance of the cantilever, and so the effects of mechanical resonance of the cantilever may dominate the effects of gate charge. For the example valve discussed above, the mechanical resonance frequency may be slightly above 1 MHz; to achieve this, the reduction of squeeze-film damping through vacuum packaging may be required if large cantilever slews are desired. The resonance frequency will increase with the square of decreasing cantilever length. Thus, as the valve is reduced in size, the response becomes quicker. Additionally, the use of thinner and less bulky materials for the cantilever, possibly permitted by advanced nanofabrication technologies, may increase the speed of response.

Embodiments of electromechanical devices in accordance with the present disclosure may provide for a tunneling nanoelectromechanical system analog valve capable of operating below 1.0 V while exhibiting a transconductance superior to the 1.0 decade per 60 mV that is characteristic of semiconductor transistors. Such devices may be incorporated in and function as part of analog circuits. Given their large expected transconductance, and their low-voltage capability, such devices may be well suited for low-voltage ultra-low-power analog circuits such as front-end amplifiers and A/D converters. For instance, such devices may be used in a high-gain amplifier for use as a voltage comparator. For example, the comparator may be employed to develop a 3-bit flash A/D converter operating with a supply voltage well below 1.0 V.

FIG. 26 illustrates an embodiment of a laterally-actuated electromechanical device. The process flow for fabricating this type of device may differ than that with respect to a vertically-actuated device. In this embodiment, the source and drain electrodes are fabricated prior to delivery of an organic thin film between the electrodes. That is, the source electrode is deposited on a substrate, and the drain electrode is deposited on a separate substrate, and the electrodes are spaced apart a suitable distance from one another. A suitable organic thin film is delivered through a gas phase and adhered to both electrodes. For example, a dithiol may be deposited on each electrode so that free sulfur atoms on each end of the dithiol forms a bond with oppositely positioned electrodes. The fabricated device may then be appropriately operated according to methods described herein.

FIG. 27 illustrates the observed exponential increase in tunneling current as the gap between electrodes is narrowed. According to the relationship provided, the tunneling current through a molecular layer such as an alkane thiol increases exponentially with a decrease in tunneling length. For instance, when the separation distance provided by the gap between electrodes is approximately 4 nm, the current between electrodes, while not in all embodiments, is shown to be negligible, ranging predominantly between $10^{-15}$ A and $10^{-12}$ A (e.g., less than $10^{-6}$ A, less than $10^{-9}$, A less than $10^{-12}$ A), depending on the applied voltage. Yet, when the gap between electrodes is approximately 2 nm, the current between electrodes jumps several orders of magnitude (e.g., by $10^9$ in orders of magnitude) to a current that ranges between $10^{-6}$ A and $10^{-3}$ A, for some embodiments, and depending on the applied voltage. In the embodiment of FIG. 27, when the gap between electrodes is approximately 0.5 nm, the current between electrodes increases even more orders of magnitude, ranging between $10^3$ A and $10^6$ A. It can be appreciated that other tunneling gaps corresponding to other ranges currents may be observed for various electromechanical devices in accordance with the present disclosure.

Figure 28:
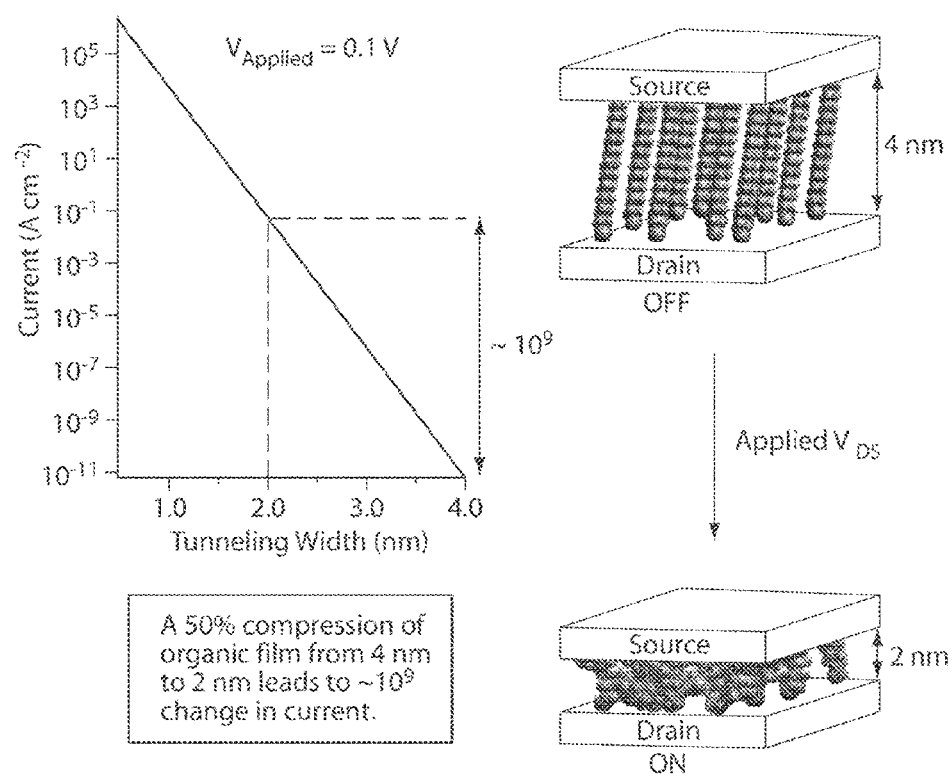
FIG. 28 shows the relationship between current and tunneling width for various electromechanical devices in accordance with some embodiments.

As shown in FIG. 28, when the organic thin film between electrodes of a suitable electromechanical device is compressed from an open to closed switch position, such as from 4 nm to 2 nm, the current may increase substantially, for example, by ~$10^9$ times.

Though, it can be appreciated that electromechanical devices in accordance with the present disclosure may be configured and arranged such that various properties and characteristics of respective open and closed switch positions may vary appropriately.

For example, when in an open switch position, the electrodes may be spaced an appropriate distance apart from one another. In some embodiments, in an open switch position, the electrodes are spaced apart a distance of greater than 3.0 nm, greater than 3.5 nm, greater than 4.0 nm, greater than 4.5 nm, greater than 5.0 nm, greater than 6.0 nm, greater than 7.0 nm, greater than 8.0 nm, greater than 9.0 nm, greater than 10.0 nm, or greater. In some embodiments, in an open switch position, the electrodes are spaced apart a distance of less than 20.0 nm, less than 15.0 nm, less than 10.0 nm, less than 9.0 nm, less than 8.0 nm, less than 7.0 nm, less than 6.0 nm, less than 5.0 nm, or less.

When in a closed switch position, the electrodes may be spaced a suitable distance from one another that is closer together than when the electrodes are in the open switch position. In some embodiments, in a closed switch position, the electrodes are spaced apart a distance of less than 10.0 nm, less than 9.0 nm, less than 8.0 nm, less than 7.0 nm, less than 6.0 nm, less than 5.0 nm, less than 4.0 nm, less than 3.5 nm, less than 3.0 nm, less than 2.5 nm, less than 2.0 nm, less than 1.5 nm, less than 1.0 nm, less than 0.5 nm, or less. In some embodiments, in a closed switch position, the electrodes are spaced apart a distance of greater than 1.0 nm, greater than 2.0 nm, greater than 2.5 nm, greater than 3.0 nm, greater than 3.5 nm, greater than 4.0 nm, greater than 5.0 nm, greater than 6.0 nm, greater than 7.0 nm, or greater. In an embodiment, when the distance between electrodes is less than 3 nm, or less than 2 nm, the device is in a closed switch position, where the electrodes are close enough to accommodate for direct tunneling therebetween. Conversely, for the same embodiment, when the distance between electrodes is greater than 3 nm, the device is in an open switch position, where the electrodes are not close enough for direct tunneling to occur. The separation distance between electrodes may fall within ranges having upper and/or lower ends according to any of the above noted values, or other values. It can be appreciated that the distance between electrodes for devices in accordance with the present disclosure, for open and/or closed switch positions, may fall outside of the above noted ranges. In some cases, the spacing between electrodes is governed by the thickness of an elastically deformable layer separating the electrodes.

FIGS. 29-30 show respective examples of two and three terminal electromechanical devices where it was observed that when the elastically deformable layer has a stiffness (i.e., spring constant) that falls within a particular range (e.g., less than about 6.5 MPa), application of a relatively low voltage (e.g., less than about 1.0 V) was sufficient to actuate the device between on and off states. As noted above, in general, the lower the stiffness of the elastically deformable layer, the lower the actuation voltage for actuating the device from open to closed switch positions.

FIG. 31 shows a table of a number of examples of electromechanical devices including an elastically deformable self-assembling monolayer film separating opposing electrodes. The performance limits of the device in terms of minimum actuation voltage, switching energy and switching time are evaluated as functions of the Young's modulus of the self-assembling monolayer. Here, while not a requirement of all embodiments of the present disclosure, a Young's modulus at or below approximately 1.0 MPa may allow for a minimum actuation voltage in the millivolt range, a switching energy less than 10 keV and nanosecond switching. While a lower stiffness of the elastically deformable layer may lead to lower actuation voltage for the device, due to the relaxation properties of the organic molecules, the switching time may increase. Though, it can be appreciated that a number of factors may affect switching time of the device, for example, Young's modulus of the molecular layer, electrode dimensions, electrode mass, applied voltage, amongst others.

In some embodiments, tunneling phenomena of electromechanical devices described herein are not significantly affected by temperature. Further, with the proper choice of metal, the mechanical properties and electromechanical motions of the materials forming the tunneling gaps may also be made largely unaffected by temperature over a significant range. Thus, by employing embodiments of devices in accordance with the present disclosure in electronic systems, the electrical performance of such electronics would not be sensitive to temperature, enabling successful deployment in extreme environments.

It should also be understood that, unless clearly indicated to the contrary, in any methods claimed herein that include more than one step or act, the order of the steps or acts of the method is not necessarily limited to the order in which the steps or acts of the method are recited.

While aspects of the invention have been described with reference to various illustrative embodiments, such aspects are not limited to the embodiments described. Thus, it is evident that many alternatives, modifications, and variations of the embodiments described will be apparent to those skilled in the art. Accordingly, embodiments as set forth herein are intended to be illustrative, not limiting. Various changes may be made without departing from the spirit of aspects of the invention.

What is claimed is:

1. An electromechanical device, comprising:
   a first electrode;
   a second electrode spaced from the first electrode; and
   an elastically deformable layer, substantially free of electrically conductive material and having a stiffness of less than 100 MPa, disposed between the first electrode and the second electrode,
   wherein the first and second electrodes are constructed and arranged such that, upon compression of the elastically deformable layer, a distance between the first electrode and the second electrode decreases, such that the electromechanical device transitions from being in an open switch position to being in a closed switch position in which a tunneling current flows between the first and second electrodes.

2. The electromechanical device of claim 1, wherein the second electrode is spaced less than 20 nm from the first electrode when the electromechanical device is in the open switch position.

3. The electromechanical device of claim 1, further comprising a buffer layer disposed between the elastically deformable layer and one of the first and second electrodes.

4. The electromechanical device of claim 1, wherein the elastically deformable layer has a stiffness of less than 10 MPa.

5. The electromechanical device of claim 1, wherein, upon application of a compressive force between the first electrode and the second electrode, the elastically deformable layer is adapted to deform from a first thickness to a second thickness and, upon release of the compressive force between the first electrode and the second electrode, the elastically deformable layer is adapted to return from the second thickness to the first thickness, wherein the first thickness is greater than the second thickness.

6. The electromechanical device of claim 1, wherein the first and second electrodes are arranged such that, upon application of a compressive force between the first electrode and the second electrode, a relative spacing between the first and second electrodes is reduced, and upon release of the compressive force between the first electrode and the second electrode, the relative spacing between the first and second electrodes is increased.

7. The electromechanical device of claim 1, wherein the elastically deformable layer comprises a self-assembled monolayer.

8. The electromechanical device of claim 1, wherein the elastically deformable layer comprises a thiol molecule.

9. The electromechanical device of claim 1, wherein the elastically deformable layer comprises at least one of polyethylene glycol dithiol and fluorinated alkanethiol.

10. The electromechanical device of claim 1, wherein the elastically deformable layer comprises at least one of triptycene and dibenzocyclooctatetraene.

11. The electromechanical device of claim 1, wherein the elastically deformable layer includes a dendrimer.

12. The electromechanical device of claim 1, wherein the elastically deformable layer is adapted to prevent contact between the first electrode and the second electrode.

13. An electromechanical device, comprising:
   a first electrode;
   a second electrode spaced from the first electrode; and
   an elastically deformable material, substantially free of electrically conductive material, disposed between the first electrode and the second electrode, wherein the first and second electrodes are constructed and arranged such that, upon application of a potential difference of no more than 1.0 V between the first and second electrodes, the potential difference causes a distance between the first and second electrodes to decrease, causing the electromechanical device to transition from being in an open switch position to being in a closed switch position.

14. The electromechanical device of claim 13, wherein the second electrode is spaced less than 20 nm from the first electrode when the electromechanical device is in the open switch position.

15. The electromechanical device of claim 13, further comprising a buffer layer disposed between the elastically deformable material and one of the first or second electrodes.

16. The electromechanical device of claim 13, wherein the elastically deformable material has a stiffness of less than 10 MPa.

17. The electromechanical device of claim 13, wherein, upon application of a compressive force between the first electrode and the second electrode, the elastically deformable material is adapted to deform from a first thickness to a second thickness and, upon release of the compressive force between the first electrode and the second electrode, the elastically deformable material is adapted to return from the second thickness to the first thickness, wherein the first thickness is greater than the second thickness.

18. An electromechanical device, comprising:
a first electrode;
a second electrode spaced from the first electrode; and
an elastically deformable material, substantially free of electrically conductive material, disposed between the first electrode and the second electrode,
wherein the first and second electrodes are constructed and arranged such that, upon compression of the elastically deformable material, a distance between the first and second electrodes decreases, causing the electromechanical device to transition from being in an open switch position to being in a closed switch position, and wherein a tunneling current that flows between the first and second electrodes while the electromechanical device is in the closed switch position is at least $10^6$ greater than a tunneling current that flows between the first and second electrodes while the electromechanical device is in the open switch position.

19. The electromechanical device of claim 18, wherein the second electrode is spaced less than 20 nm from the first electrode when the electromechanical device is in the open switch position.

20. The electromechanical device of claim 18, wherein, upon application of a compressive force between the first electrode and the second electrode, the elastically deformable material is adapted to deform from a first thickness to a second thickness and, upon release of the compressive force between the first electrode and the second electrode, the elastically deformable material is adapted to return from the second thickness to the first thickness, wherein the first thickness is greater than the second thickness.

* * * * *